(12) United States Patent
Feng et al.

(10) Patent No.: US 7,777,991 B2
(45) Date of Patent: Aug. 17, 2010

(54) HEAD GIMBAL ASSEMBLY WITH IMPROVED INTERCONNECTION BETWEEN HEAD SLIDER AND SUSPENSION, FABRICATING METHOD THEREOF, AND MAGNETIC DISK DRIVE WITH THE SAME

(75) Inventors: XianWen Feng, Dongguan (CN); YiHua Pei, Dongguan (CN); JuGang Zhang, Dongguan (CN); ShuMing Zhang, Dongguan (CN); Takeshi Nakada, HongKong (CN); ShanLin Hao, HongKong (CN)

(73) Assignee: SAE Magnetics (H.K.) Ltd., Hong Kong (CN)

( * ) Notice: Subject to any disclaimer, the term of this patent is extended or adjusted under 35 U.S.C. 154(b) by 888 days.

(21) Appl. No.: 11/652,647

(22) Filed: Jan. 12, 2007

(65) Prior Publication Data

US 2008/0170326 A1 Jul. 17, 2008

(51) Int. Cl.
*G11B 5/56* (2006.01)
(52) U.S. Cl. .................................................. 360/245.3
(58) Field of Classification Search ....................... None
See application file for complete search history.

(56) References Cited

U.S. PATENT DOCUMENTS

| | | | |
|---|---|---|---|
| 7,312,955 B2* | 12/2007 | Kuwajima et al. | 360/294.4 |
| 7,403,357 B1* | 7/2008 | Williams | 360/245.9 |
| 7,408,745 B2* | 8/2008 | Yao et al. | 360/294.4 |
| 7,535,680 B2* | 5/2009 | Yao et al. | 360/294.4 |
| 7,663,843 B2* | 2/2010 | Yao | 360/265 |
| 2005/0162783 A1* | 7/2005 | Yao et al. | 360/294.4 |
| 2005/0286176 A1* | 12/2005 | Yao et al. | 360/294.4 |
| 2006/0082917 A1* | 4/2006 | Yao et al. | 360/75 |
| 2007/0076327 A1* | 4/2007 | Yang et al. | 360/294.4 |

* cited by examiner

*Primary Examiner*—Mark Blouin
(74) *Attorney, Agent, or Firm*—Nixon & Vanderhye P.C.

(57) ABSTRACT

A head gimbal assembly (HGA) has an improved interconnection between a head slider and a suspension of the HGA. The interconnection is achieved by using a reverse surface of an air bearing surface of the head slider as bonding surface to provide more space for arranging more slider electrical bonding pads thereon. The head slider is mechanically and electrically connected to the suspension at the bonding surface to have good performance on shocking conditions. The suspension further has an attitude control layer located between the head slider and the suspension. The attitude control layer serves as a datum plate for the head slider lying thereon and supporting the head slider so as to ensure the head slider a good attitude and reduce variation of slider flying height. The present invention also discloses a magnetic disk drive with the improved HGA and a fabricating method for the HGA.

39 Claims, 14 Drawing Sheets

HEAD GIMBAL ASSEMBLY WITH IMPROVED INTERCONNECTION BETWEEN HEAD SLIDER AND SUSPENSION, FABRICATING METHOD THEREOF, AND MAGNETIC DISK DRIVE WITH THE SAME

FIELD OF THE INVENTION

The present invention relates in general to an information recording disk drive device. More particularly, this invention relates to a head gimbal assembly with an improved interconnection between a head slider and a suspension of the assembly, and a method for fabricating the head gimbal assembly, and a magnetic disk drive with the improved head gimbal assembly.

BACKGROUND OF THE INVENTION

Disk drives are information storage devices that use magnetic media to store data and a movable read/write head positioned over the magnetic media to selectively read data from and write data to the magnetic media.

Typically, referring to FIG. 1, a disk drive contains a number of magnetic disks 6 attached to a common spindle motor for rotation. The surface of the magnetic disk 6 suspends an associated head arm assembly that includes a head gimbal assembly (HGA) 1. The head gimbal assembly 1 is generally attached to and mounted on a drive arm 4. A voice-coil motor (VCM) 5 is connected to the drive arm 4 for controlling the motion of the drive arm 4 and, in turn, controlling a magnetic transducer incorporated by a head slider 2 of the HGA 1 to position with reference to data tracks across the surface of the magnetic disk 6, thereby enabling the magnetic transducer to read data from or write data to the disk 6.

The HGA 1 serves to dynamically adjust the orientation of the head slider 2 to conform to the disk surface while the disk 6 is being spun by the spindle motor. More specifically, the HGA 1 generally comprises a suspension to load or suspend the slider thereon. The suspension includes a load beam, a base plate, a hinge and a flexure, all of which are assembled together. The load beam is connected to the base plate by the hinge, and the base plate is used to enhance structure stiffness of the whole HGA. The flexure is made of flexible material and runs from the hinge to the load beam. One end of the load beam is mounted to the drive arm by means of the base plate, and the other end of the load beam is attached to the flexure. The load beam biases the head slider toward the surface of the magnetic disk, while the flexure provides flexibility for the head slider. A suspension tongue is provided at an end of the flexure to carry the head slider thereon.

Referring now to FIGS. 2a-2b, conventionally, the head slider 2 typically has a transducer provided on a trailing surface 23 thereof for reading and writing data on the concentric data tracks of the disks 6, as is well known in the art. For electrical connection, the transducer provides several bonding pads 24 formed on the trailing surface 23 of the head slider 2, and the flexure 3 provides corresponding bonding pads 10 which are already common with transducer traces extending from a read/write electronic circuit (not shown) of the disk drive. The transducer traces serve to conduct signals between the transducer and the read/write electronic circuit for control. The bonding pads 24 of the transducer are respectively soldered or ultrasonically bonded with bonding pads 10 of the flexure 3 via solder or metal balls 8 thus implementing electrical connection therebetween. In addition, for achieving a strong physical bonding performance, epoxy adhesive 7 is applied to a top surface 22 of the head slider 2 facing the flexure 3 and opposite the air bearing surface 21 of the head slider 2, and the epoxy adhesive 7 bonds the top surface 22 of the head slider 2 to the flexure 3.

However, the method for interconnection the head slider 2 and the flexure 3 of the suspension described above is complicated. As is illustrated above, the head slider 2 is designed to be attached with the flexure 3 firstly by bonding solder or metal balls 8 between corresponding pads and secondly by applying epoxy adhesive 7 to fix the head slider 2 and the flexure 3 firmly. The electrical and mechanical connection between the head slider 2 and the flexure 3 are two separate assembly processes, which are time-consuming and laborious.

More recently, consumers are constantly desiring to decrease the cost of head sliders. To decrease the cost of head slider, slider size is subjected to be designed smaller and smaller so that one wafer can be separated to more head sliders. Because of the head slider's size decreasing, the area of the trailing surface 23 has become smaller too. Simultaneously, with the improvement of slider technology, more and more functional bonding pads 24 are required to be added on the trailing surface 23. Thus, a smaller size head slider can no longer provide enough space for bonding connection at the slider's trailing surface 23. On the other hand, the traditional interconnection between the head slider 2 and the flexure 3 at the trailing surface 23 by solder or metal balls 8 can be damaged by shock stress or even cracked because the head slider 2 and the flexure 3 may rotate relative to each other about the interconnection point.

At present, a more advanced typical interconnection between the head slider and the suspension has been introduced to solve the above problems. The head slider provides a plurality of slider electrical bonding pads on the top surface opposite to the air bonding surface thereof, and the suspension provides a plurality of corresponding flexure electrical bonding pads. The slider electrical bonding pads are bonded to the flexure electrical bonding pads via bonding solder or metal balls to establish mechanical and electrical interconnection between the head slider and the suspension. In this case, the top surface of the head slider can provide enough space for arranging slider electrical bonding pads, and the interconnection between the head slider and the suspension prevents rotation therebetween. However, this method may introduce another problem. As the head slider is supported by solder bonding without any datum, the head slider's static pitch attitude and static roll attitude may vary, and accordingly, the variation of pitch and roll attitude will cause variation of slider flying height, which degrades flying performance of the head slider, as well as data reading/writing performance.

Hence, a strong need has arisen for providing a head gimbal assembly with an improved interconnection between the head slider and the suspension, a magnetic disk drive with the improved head gimbal assembly, and an improved method for fabricating the head gimbal assembly to overcome the above disadvantages.

SUMMARY OF THE INVENTION

Accordingly, an object of the present invention is to provide a head gimbal assembly (HGA) with an improved interconnection between a head slider and a suspension of the HGA capable of controlling the attitude such as pitch attitude and roll attitude of the head slider to ensure the head slider a good attitude and, in turn, reducing flying height variation of the head slider, thereby improving data reading/writing performance of the head slider.

A further object of the present invention is to provide a magnetic disk drive having a head gimbal assembly (HGA) with an improved interconnection between a head slider and a suspension of the HGA capable of controlling the attitude such as pitch attitude and roll attitude of the head slider to ensure the head slider a good attitude and, in turn, reducing flying height variation of the head slider, thereby improving data reading/writing performance of the head slider.

Another object of the present invention is to provide a method of fabricating a head gimbal assembly capable of achieving an improved interconnection between a head slider and a suspension of the HGA.

Still another object of the present invention is to provide a suspension for supporting a head slider with an attitude control layer to control the attitude such as pitch attitude and roll attitude of the head slider when assembled with the suspension, therefore to ensure the head slider a good attitude.

To achieve the above-mentioned objects, the present invention provide a head gimbal assembly comprising a head slider and a suspension. The head slider has an air bearing surface, a bonding surface opposite to the air bearing surface, and a plurality of slider electrical bonding pads arranged on the bonding surface. The suspension has a flexure, an attitude control layer, and a plurality of flexure electrical bonding pads arranged on the flexure. The attitude control layer is covered on the flexure with the flexure electrical bonding pads exposed. The head slider is disposed on the attitude control layer with the slider electrical bonding pads aligning with the respective flexure electrical bonding pads so that the slider electrical bonding pads and the respective flexure electrical bonding pads are electrically connected.

As an embodiment of the present invention, the suspension further comprises a trace pattern disposed on the flexure, and the flexure electrical bonding pads are integrally formed with the trace pattern. Preferably, the trace pattern defines concave portions at positions corresponding to the flexure electrical bonding pads. Also preferably, the concave portions are pierced to be through holes. Alternatively, the flexure also defines concave portions at positions corresponding to the through holes of the trace pattern.

As another embodiment of the present invention, the flexure comprises a metal substrate and an insulation layer, and the insulation layer is sandwiched between the metal substrate and the trace pattern. Preferably, the metal substrate has a stress-releasable portion partially hollowed out at a position under the flexure electrical bonding pads. The stress-releasable portion has a plurality of through holes or cutouts symmetrically arranged. Also preferably, the insulation layer defines a plurality of concave portions at positions corresponding to the flexure electrical bonding pads.

In the invention, the trace pattern has a plurality of conductive traces extending from the flexure electrical bonding pads respectively to an external control circuitry, and the attitude control layer is configured to at least partially cover the conductive traces.

As another embodiment of the present invention, the attitude control layer is T-shaped. Alternatively, the attitude control layer has a T-shaped head portion for covering the conductive traces between the flexure electrical bonding pads and a pair of arm portions for covering the conductive traces around the flexure electrical bonding pads. Alternatively, the attitude control layer has an H-shaped head portion for covering the conductive traces between the flexure electrical bonding pads and a pair of arm portions for covering the conductive traces around the flexure electrical bonding pads.

As still another embodiment of the present invention, the head slider further comprises a semi-insulation layer with a plurality of notches, and the semi-insulation layer is covered on the bonding surface of the head slider and electrically connected to the head slider with the slider electrical bonding pads exposed in the respective notches. Preferably, the semi-insulation layer is a diamond-like carbon layer. Alternatively, the slider electrical bonding pads comprise an ESD bonding pad electrically connecting the semi-insulation layer and the head slider.

In the invention, the head slider further has a plurality of secondary bonding pads located on a trailing surface of the head slider, and the secondary bonding pads electrically connects to the respective slider electrical bonding pads.

As still another embodiment of the present invention, the head slider further comprises a metal lead layer, a first insulation layer sandwiched between the bonding surface of the head slider and the metal lead layer, and a second insulation layer covered on the metal lead layer. The slider electrical bonding pads are integrally formed with the metal lead layer, and the second insulation layer provides a plurality of notches for exposing the respective slider electrical bonding pads therein.

Preferably, the metal lead layer has at least one ground trace, and the slider electrical bonding pads comprises at least one ground bonding pad connecting the ground trace, a heater pad, at least one reader bonding pad, and at least one writer bonding pad. The ground trace is disposed between the reader bonding pad and the writer bonding pad.

A magnetic disk drive of the present invention comprises a head gimbal assembly, a drive arm to connect with the head gimbal assembly, a disk, and a spindle motor to spin the disk. The head gimbal assembly comprises a head slider and a suspension. The head slider has an air bearing surface, a bonding surface opposite to the air bearing surface, and a plurality of slider electrical bonding pads arranged on the bonding surface. The suspension has a flexure, an attitude control layer, and a plurality of flexure electrical bonding pads arranged on the flexure. The attitude control layer is covered on the flexure with the flexure electrical bonding pads exposed. The head slider is disposed on the attitude control layer with the slider electrical bonding pads aligning with the respective flexure electrical bonding pads so that the slider electrical bonding pads and the respective flexure electrical bonding pads are electrically connected.

A method of fabricating a head gimbal assembly of the present invention comprises steps of: (1) providing a head slider which has an air bearing surface and a bonding surface opposite to the air bearing surface; (2) disposing a plurality of slider electrical bonding pads on the bonding surface of the head slider; (3) forming a flexure and disposing a plurality of flexure electrical bonding pads on the flexure; 4) forming an attitude control layer and covering the attitude control layer on the flexure with the flexure electrical bonding pads exposed; and (5) disposing the head slider on the attitude control layer with the slider electrical bonding pads aligning with the respective flexure electrical bonding pads and electrically connecting the slider electrical bonding pads to the respective flexure electrical bonding pads.

As an embodiment of the present invention, between steps (2) and (3) further comprises steps of: forming a semi-insulation layer and defining a plurality of notches in the semi-insulation layer; and covering the semi-insulation layer on the bonding surface of the head slider with the slider electrical bonding pads exposed in the respective notches and electrically connecting the semi-insulation layer to the head slider.

Alternatively, the semi-insulation layer is made of diamond-like carbon.

Preferably, the flexure electrical bonding pads are formed on a trace pattern made of conductive material. The step (3) comprises a step of defining concave portions in trace pattern at positions corresponding to the flexure electrical bonding pads.

A suspension for supporting a head slider of the present invention comprises a flexure, a trace pattern disposed on the flexure, and an attitude control layer. The trace pattern has a plurality of flexure electrical bonding pads. The attitude control layer is at least partially covered on the flexure and the trace pattern with the flexure electrical bonding pads exposed.

In comparison with the prior art, besides capable of providing enough space for slider electrical bonding pads and a reliable interconnection between the head slider and the suspension, the present invention further has several advantages. Firstly, the attitude control layer serves as a datum plate for the head slider lying thereon and supporting the head slider, so the head slider can align easily with the flexure so that a good attitude of the head slider is ensured. Good attitude of the head slider, namely little pitch and roll variation, can reduce flying height variation, so data reading/writing performance of the head slider is improved. Secondly, the attitude control layer is located between the head slider and the flexure so as to prevent shorting therebetween. Furthermore, the attitude control layer forms a clearance between the head slider and the flexure for easy inspection during attaching the head slider to the flexure.

Other aspects, features, and advantages of this invention will become apparent from the following detailed description when taken in conjunction with the accompanying drawings, which are a part of this disclosure and which illustrate, by way of example, principles of this invention.

BRIEF DESCRIPTION OF THE DRAWINGS

The accompanying drawings facilitate an understanding of the various embodiments of this invention. In such drawings.

DETAILED DESCRIPTION OF ILLUSTRATED EMBODIMENTS

Figure 1:
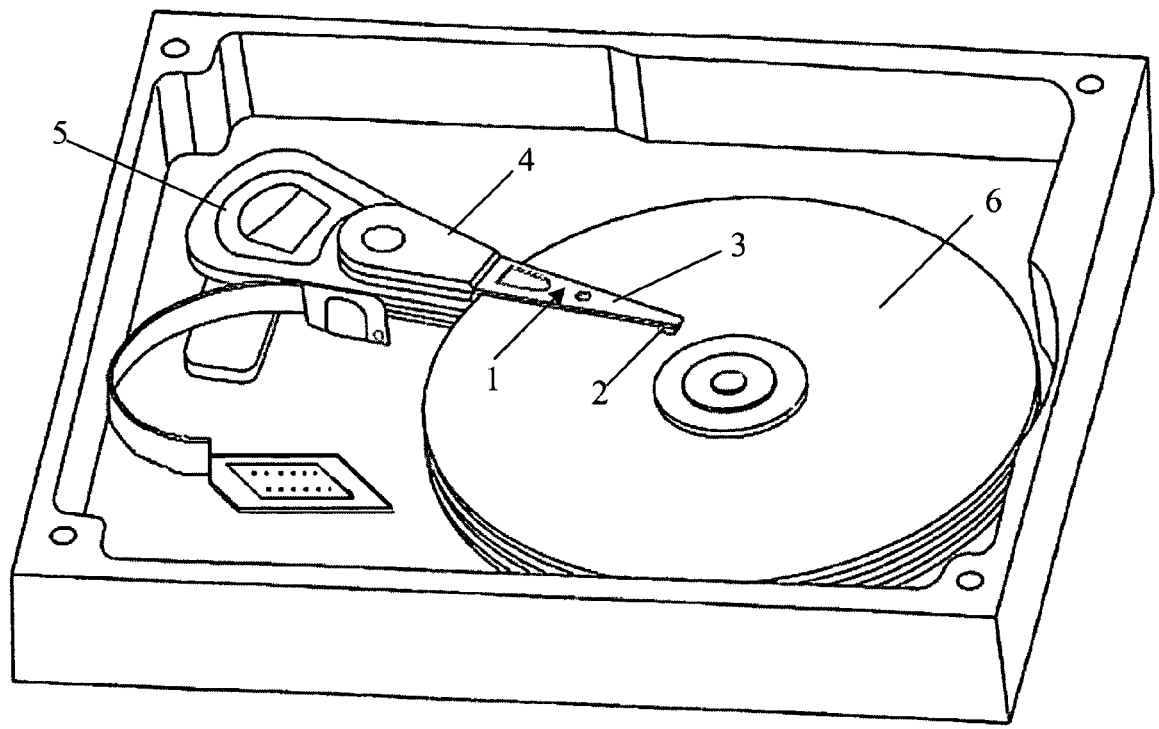
FIG. 1 is a perspective view of a conventional disk drive device.
Figure 2A:
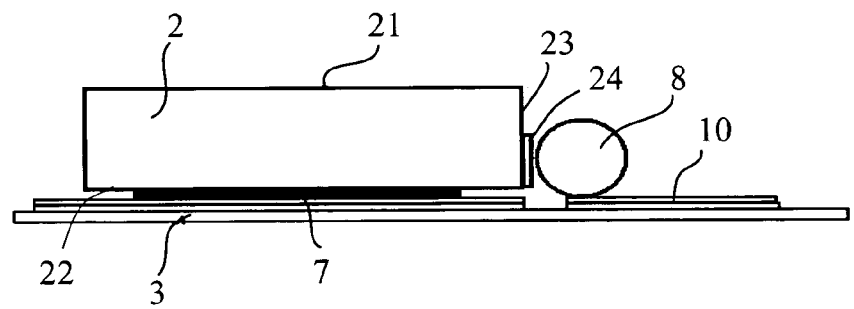
FIG. 2a is a partial side view of a conventional head gimbal assembly (HGA) of the disk drive device shown in FIG. 1, illustrating a head slider electrically connecting to a suspension at a trailing surface thereof and mechanically connecting to the suspension at a top surface thereof.
Figure 2B:
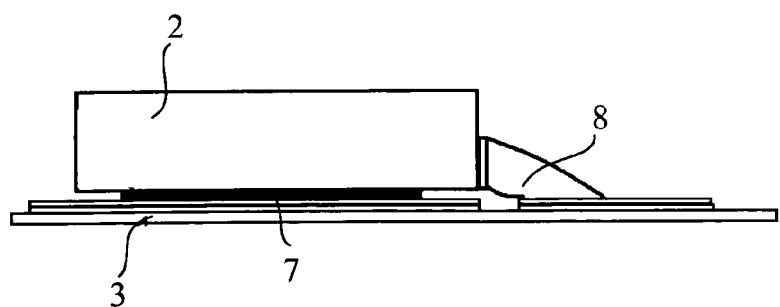
FIG. 2b is a partial side view of another conventional HGA.

Various preferred embodiments of the invention will now be described with reference to the figures, wherein like reference numerals designate similar parts throughout the various views. As indicated above, the invention is directed to a head gimbal assembly (HGA) with an improved interconnection between a head slider and a suspension of the HGA to have good performance on shocking conditions, provide more space for bonding pads, and ensure the head slider a good attitude when assembled with the suspension. The interconnection is achieved by using the reverse surface of the air bearing surface as bonding surface, providing bonding pads on the bonding surface, mechanically and electrically connecting the head slider to the suspension at the bonding surface, and locating an attitude control layer between the head slider and the suspension for the head slider lying thereon.

Figure 3:
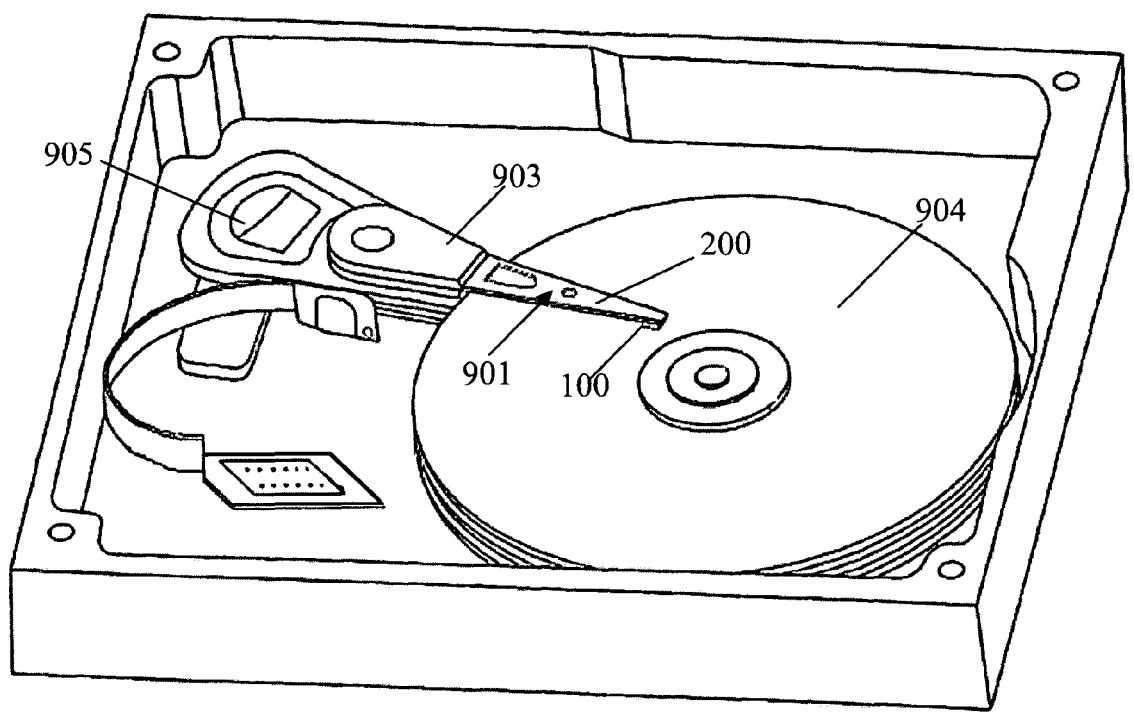
FIG. 3 is a perspective view of a magnetic disk drive according to the present invention.
Figure 4:
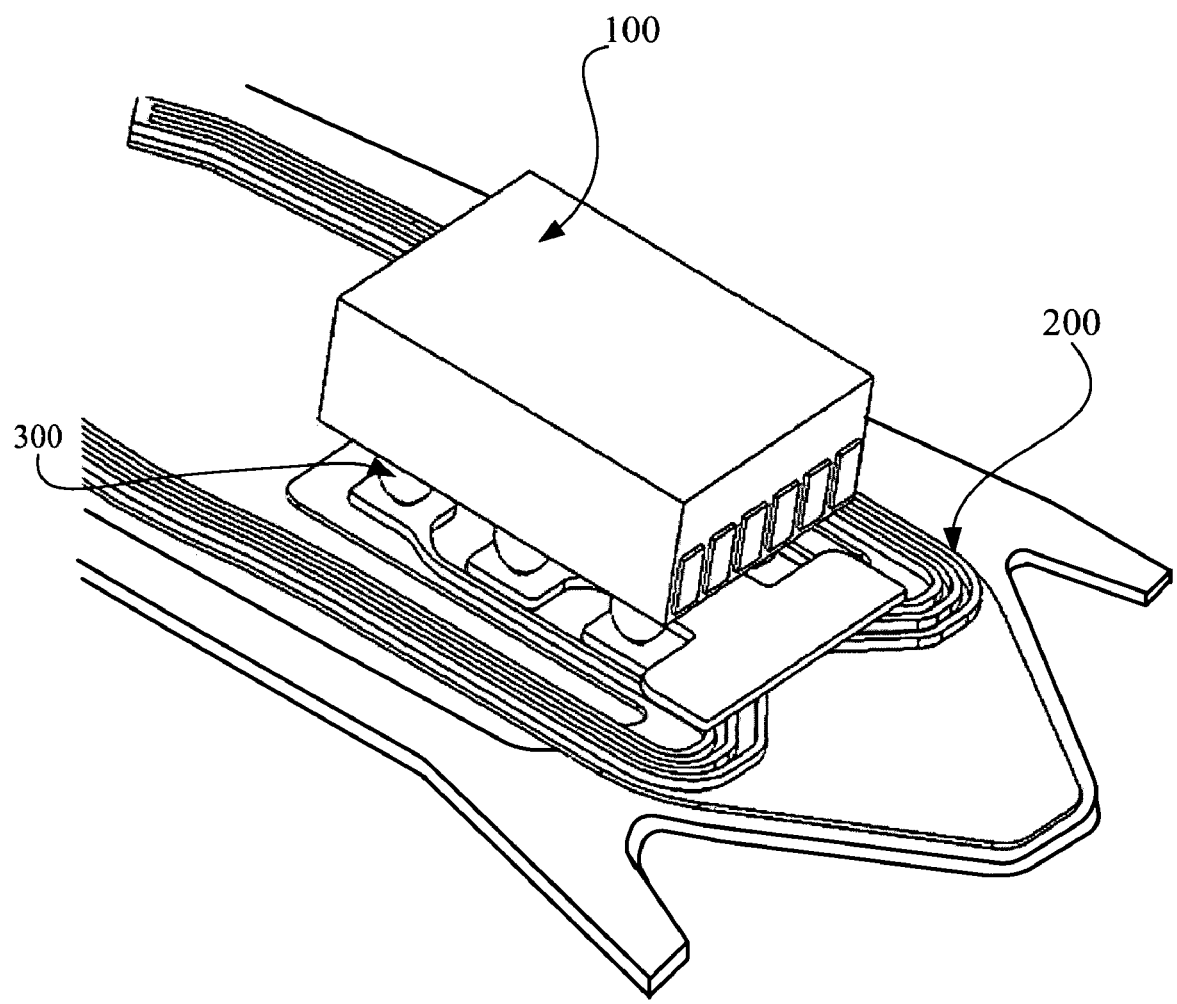
FIG. 4 is a partially enlarged perspective view of a head gimbal assembly (HGA) of the magnetic disk drive of FIG. 3, also showing a suspension without a load beam in order to facilitate clearly illustrating the principles of the invention.

Referring now more particularly to the accompanying drawings, FIG. 3 is a perspective view of a magnetic disk drive in accordance with the present invention, and FIG. 4 is a partial enlarged perspective view of a head gimbal assembly of the magnetic disk drive. To appreciate the principles of the configuration and construction of the embodiments of the head gimbal assembly and the magnetic disk drive, it may be useful to explain the well-known components as well as the distinct components of this invention hereinafter.

As shown in FIG. 3, the magnetic disk drive includes a stack of spaced apart magnetic recording disks 904 rotatable about a common shaft and a head stack assembly that includes a head gimbal assembly (HGA) 901. The HGA 901, which includes a head slider 100 and a suspension 200, is attached to a drive arm 903. The head stack assembly is rotatable about an axis of the drive arm 903 and is generally attached to a voice-coil motor 905 which controls the motion of the drive arm 903 and, in turn, controls a magnetic transducer incorporated by the head slider 100 of the HGA 901 to position with reference to data tracks across the surface of the magnetic recording disk 904, thereby enabling the magnetic transducer to read data from or write data to the disk 904.

As partly shown in FIG. 3, the suspension 200 includes a load beam and a flexure secured to the load beam by welding or gluing. The load beam serves to supply a directed force to the flexure and accordingly, biases the head slider 100 toward the surface of the associated magnetic recording disk, while the flexure provides flexibility for the head slider 100. Such type of property successfully maintains the head slider 100 in a balanced equilibrium position at a desired height above the disk surface. The flexure extends toward the drive arm assembly for connection to a read/write electronic circuitry which controls the movement of the head slider 100 in the operation.

Having thus described the state of the well-known components for the head gimbal assembly and the magnetic disk drive, the invention claimed herein will now be illustrated according to FIGS. 4-21 which help to describe the principles of the subject head gimbal assembly and the magnetic disk drive as well as the suspension.

Referring to FIG. 4, the head slider 100 is electrically bonded to the suspension 200 via solder or gold bonding balls 300. The solder or gold bonding balls 300 successfully establish electrical connection of the head slider 100 and the read/write electronic circuitry.

The following details pertain primarily to the head slider 100 and the suspension 200 of the HGA 901 of the present invention.

Figure 5:
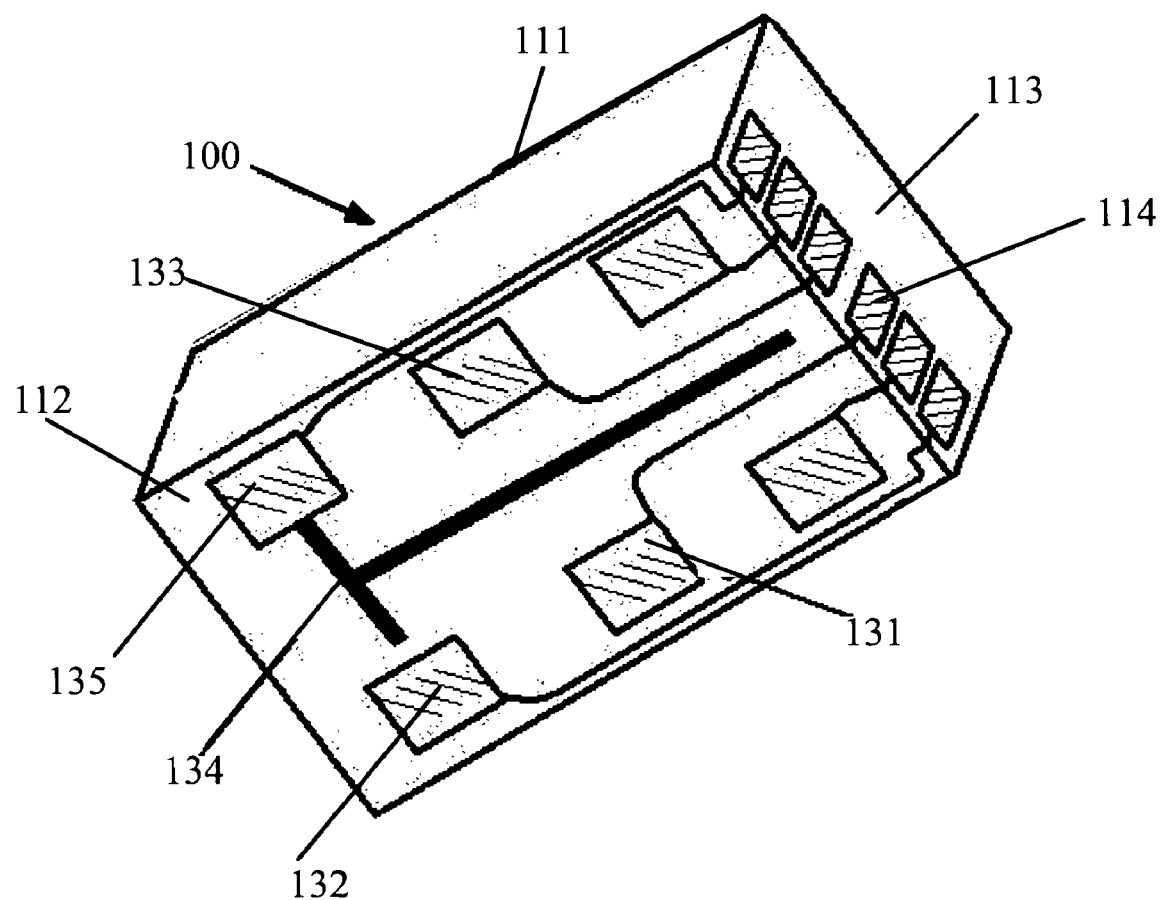
FIG. 5 is an enlarged perspective view of a head slider of a first embodiment of the HGA shown in FIG. 4.

FIG. 5 is a perspective view of the head slider 100 of a first embodiment according to the present invention. The head slider 100 has an air bearing surface 111, a bonding surface 112 opposite to the air bearing surface 111, and a plurality of slider electrical bonding pads 131, 132, 133, and 135 as well as a ground trace 134 all arranged on the bonding surface 112. The head slider 100 also brings out a plurality of secondary bonding pads 114 located on a trailing surface 113 of the head slider 100, and the secondary bonding pads 114 electrically connects to the respective slider electrical bonding pads 131, 132, 133, and 135 for conducting the controlling signal from the read/write electronic circuitry. More particularly, the slider electrical bonding pads comprises one heater pad 132, one ground bonding pad 135 connecting the ground trace 134, a pair of reader bonding pads 131 for linking reading signals, and another pair of writer bonding pads 133 for linking writing signals. The ground trace 134 is disposed between the reader bonding pads 131 and the writer bonding pads 133 for decreasing cross-talk between the reading signals and the writing signals, thereby insuring a good read/write performance of the head slider 100. The heater pad 132 connects a heating trace serving as forming a heating circuit to adjust flying height of the head slider 100 by heating.

Figure 6:
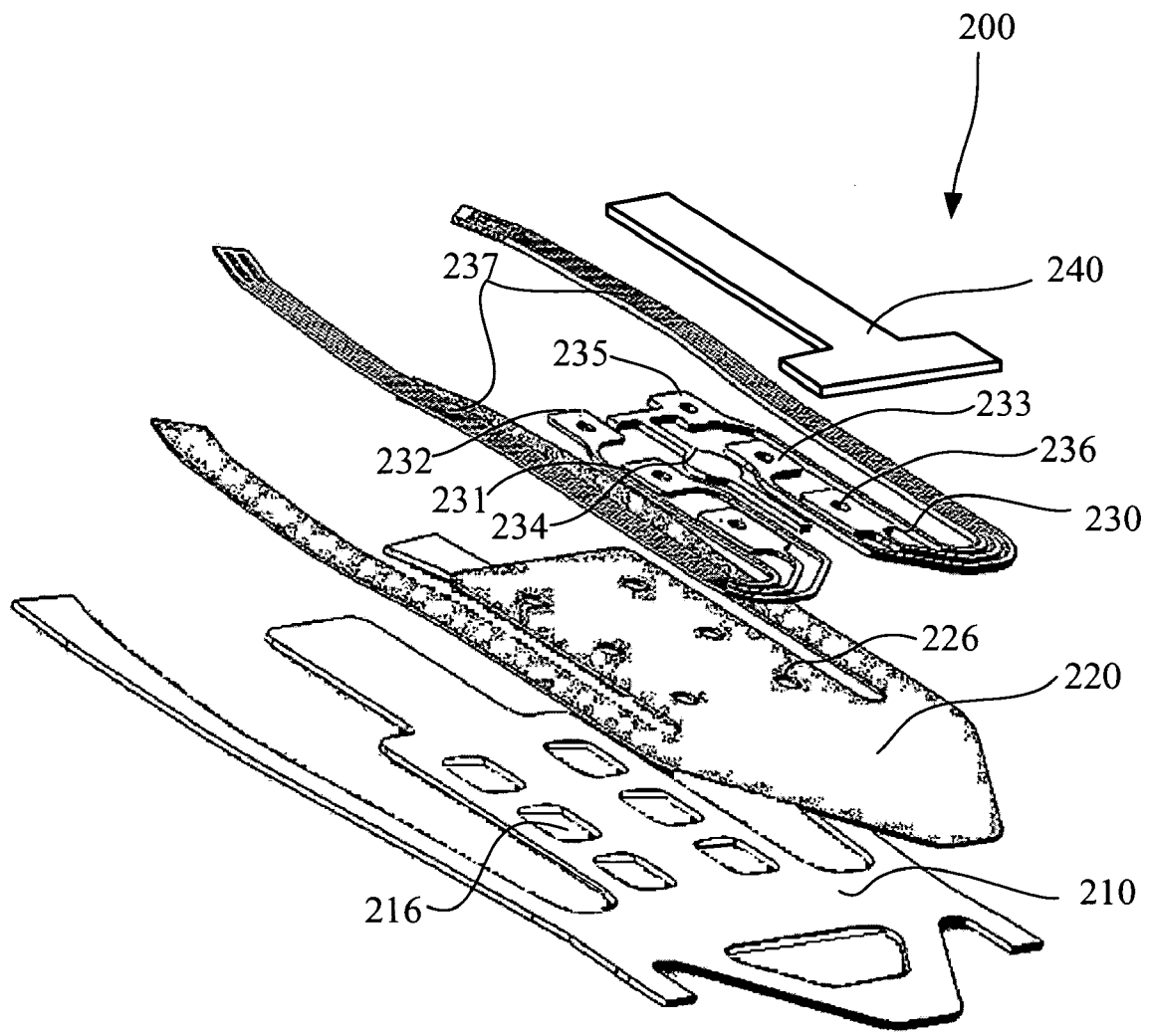
FIG. 6 is an exploded perspective view of a suspension of a first embodiment of the HGA shown in FIG. 4 according to the present invention.

FIG. 6 is an exploded perspective view of the suspension 200 of a first embodiment according to the invention. The suspension 200 includes an attitude control layer 240, a trace pattern 230, a flexure having an insulation layer 220 and a metal substrate 210.

The trace pattern 230 is disposed on the insulation layer 220, and a plurality of flexure electrical bonding pads 231, 232, 233, and 235 formed integrally with the trace pattern 230 are set to correspond with the slider electrical bonding pads 131, 132, 133, and 135 for electrical connection therebetween. The trace pattern 230 further includes a plurality of conductive traces 237, one end of which is electrically connected with the flexure electrical bonding pads, and the other end of which is coupled to the read/write electronic circuitry. More particularly, the flexure electrical bonding pads comprises one heating pad 232, one ground bonding pad 235 connecting a ground trace 234, two reader bonding pads 231 for linking reading signals, and two writer bonding pads 233 for linking writing signals. The ground trace 234 is disposed between the reader bonding pads 231 and the writer bonding pads 233 for decreasing cross-talk between the reading signals and the writing signals, thereby insuring a good read/write performance of the head slider 100. The heating pad 232 connects a heating trace extending to the read/write electronic circuitry for cooperating with the heater pad 132 of the head slider 100 to form a heating circuit to adjust flying height of the head slider 100 by heating. Preferably, the trace pattern 230 defines concave portions 236 at positions corresponding to the flexure electrical bonding pads. The configuration of the concave portions 236 of the flexure electrical bonding pads can facilitate accommodating more solder and thereby assist in getting soiled electrical connection performance relative to the head slider 100 and the suspension 200. In the preferred embodiment, the concave portions 236 are pierced to be through holes.

The attitude control layer 240 is fabricated of electric insulating material, such as polyimide or epoxy, and covered on the trace pattern 230 with the flexure electrical bonding pads exposed. The head slider 100 is disposed on the attitude control layer 240 with the slider electrical bonding pads aligning with the respective flexure electrical bonding pads so as to be connected with each other by solder or gold bonding balls 300. The head slider 100 is put directly on the attitude control layer 240, so the attitude control layer 240 serves as a datum plate to support the head slider 100 and facilitate aligning the head slider 100 with the trace pattern 230, thereby ensuring a good attitude of the head slider 100 when assembled. Particularly, the attitude control layer 240 eliminates or at least reduces the pitch and roll variation of the head slider, therefore keeps the slider flying height, so data reading/writing performance of the head slider is improved. Besides, the attitude control layer 240 helps to form a clearance between the head slider 100 and the suspension 200, thus providing possibility and condition for inspecting bonding quality during assembling. That is, as the attitude control layer 240 generally is about 20 microns in thickness, it easily allows a clearance about 20 microns in height, which is enough for molten solder bonding ball 300 after solidification. Solder appearance after solidification can be inspected by microscopes or infrared inspection instruments, and of course, the connection quality can be inspected, which supplies a chance for optimize the connecting quality. In this embodiment, the attitude control layer 240 is configured to be T-shaped, which partially covers the conductive traces 237.

The insulation layer 220 is sandwiched between the metal substrate 210 and the trace pattern 230 and is a flat, flexible sheet of material deposited on the metal substrate 210. The insulator layer 220 is made of plastic or polymeric resin material, such as polyimide, and is bonded to the trace pattern 230. In the embodiment, the insulation layer 220 serves to electrically insulate the respective conductive traces 237 and the flexure electrical bonding pads of the trace pattern 230 from shorting. Perfectly, the insulation layer 220 defines a plurality of concave portions 226 at positions corresponding to through holes 236 in the trace pattern 230. The concave portions 226 of the insulation layer 220 can further increase solder volumes. Also perfectly, the concave portions 226 in the insulation layer 220 may be pierced to be through holes 226.

The metal substrate 210 is formed under the insulation layer 220. Generally, the metal substrate 210 possesses a stress-releasable portion or structure that helps releasing thermal deformation of the suspension 200 (especially the flexure) caused by ambient temperature change. The metal substrate 210 can be formed of any suitable rigid material such as stainless steel. The stress-absorbing portion is partially hollowed out at positions under the flexure electrical bonding pads. Preferably, the stress-absorbing portion includes a plurality of cutouts or through holes symmetrically arranged. This design assists in evenly releasing stress in different directions, thus the thermal deformation of flexure due to temperature change is prevented or reduced greatly, thereby reducing or preventing deformation of the head slider 100, and of course yielding small slider pitch static attitude such as static pitch or static roll as well as little slider crown change, finally improving reading/writing characteristics of the head slider 100.

Figure 7:
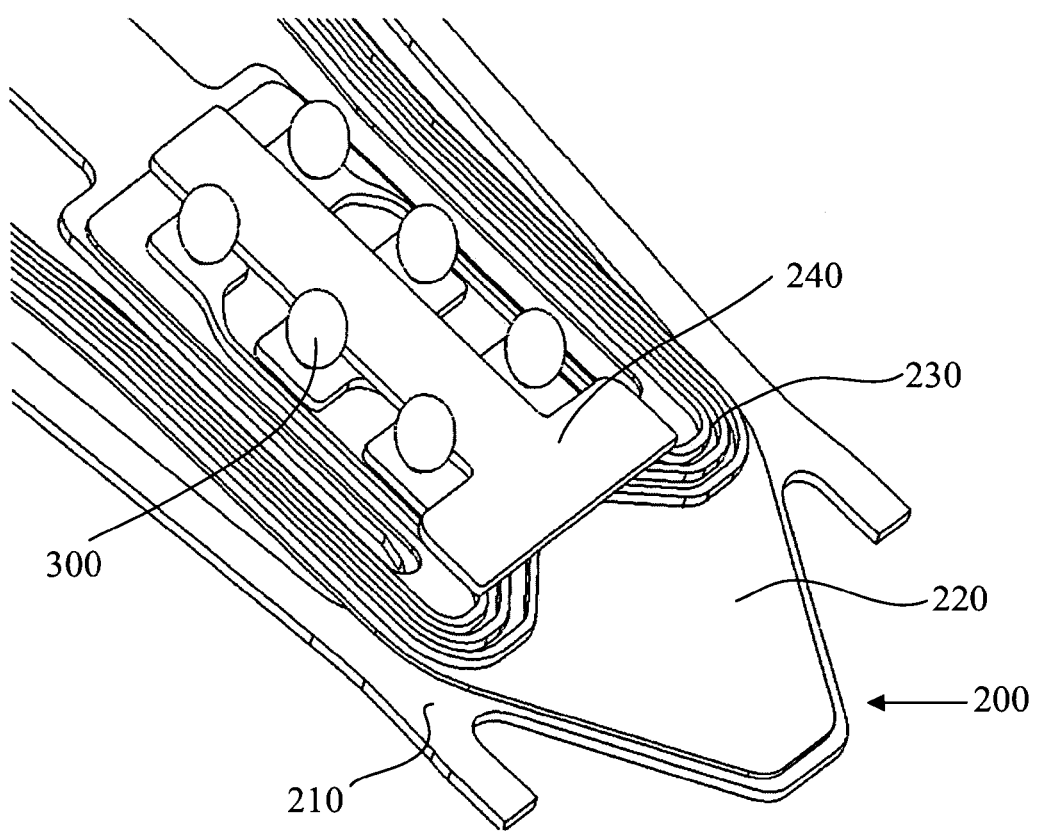
FIG. 7 is a partially enlarged, assembled perspective view of the suspension shown in FIG. 6, with which solder bonding balls are assembled.
Figure 8:
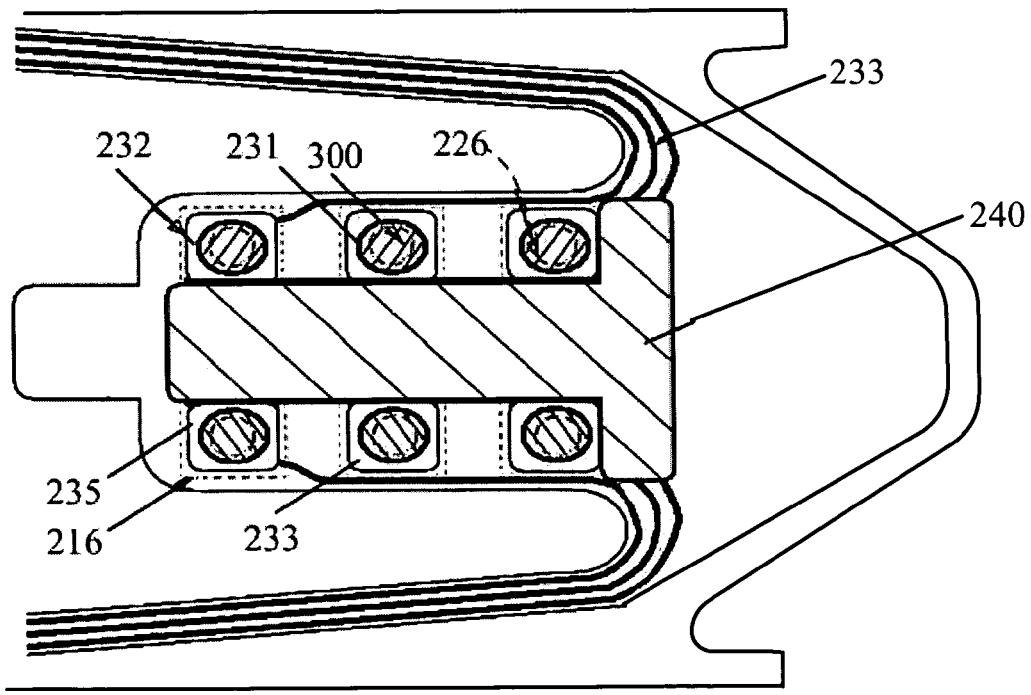
FIG. 8 is a cross-sectional view of FIG. 7.

Referring to FIGS. 7-8, the solder balls 300 are held on the respective through holes 236 of the flexure electrical bonding pads 231, 232, 233, 235 of the trace pattern 230,. The attitude control layer 240 is partially covered on the trace pattern 230 with the solder ball 300 exposed. The solder balls 300 are only one substance used for establishing electrical connection, and other type of known solid contact soldering including but not limited to electrical connection balls (solder ball bonding, SBB) or conductive adhesive can also be employed.

Figure 9:
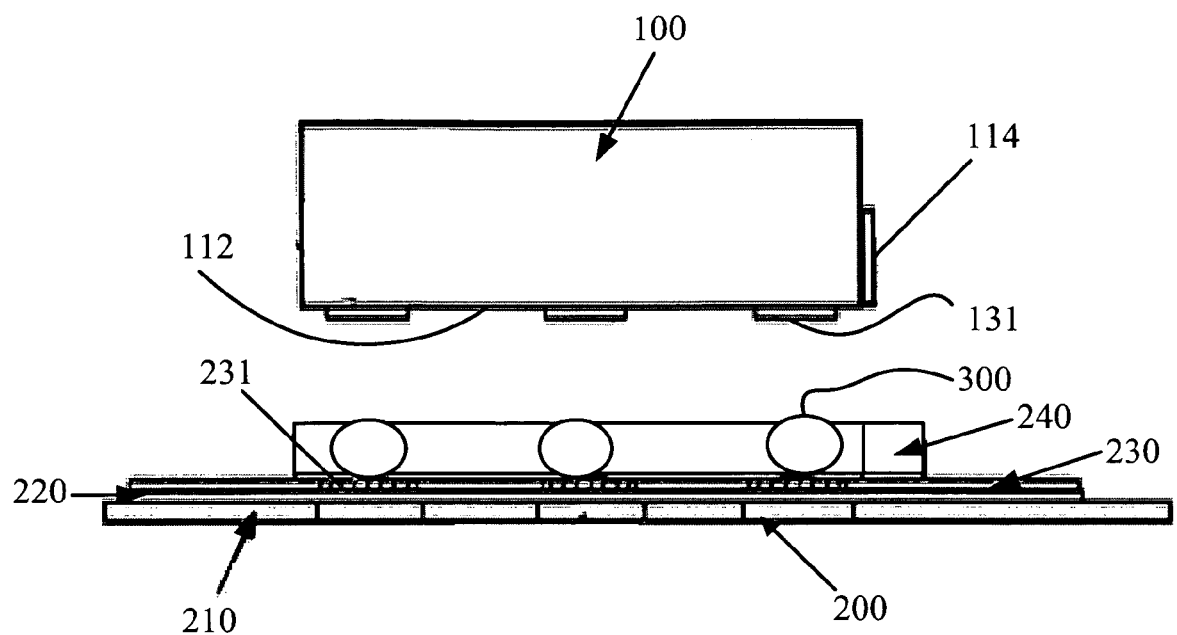
FIG. 9 is a schematic, partial side view illustrating the head slider to be assembled with the suspension shown in FIG. 7 according to the present invention.
Figure 10:
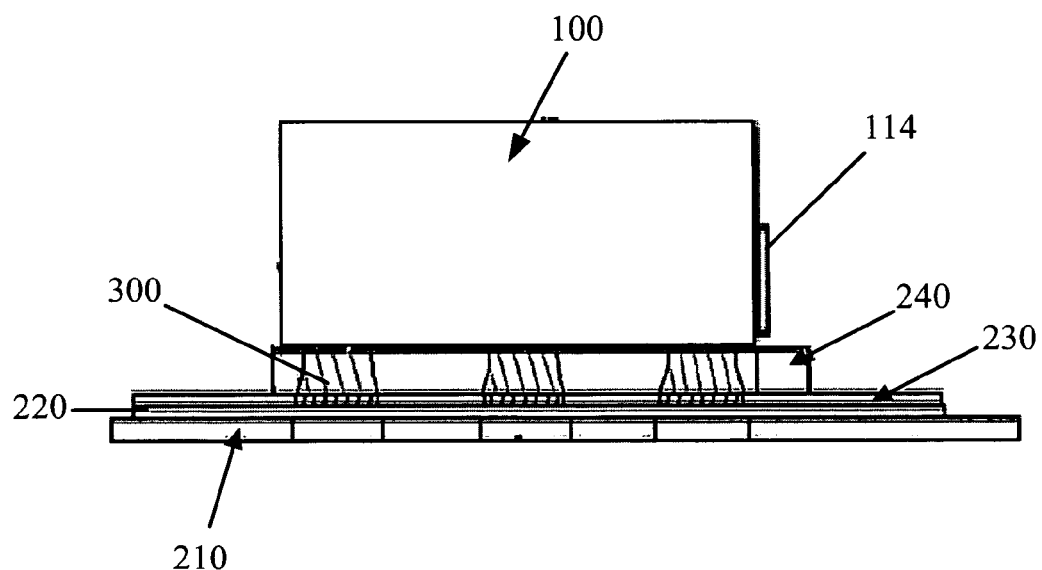
FIG. 10 is a partial side view showing the head slider assembled with the suspension shown in FIG. 9.

FIGS. 9-10 are views respectively showing the assembling state and the assembled state of the head slider 100 with the suspension 200 via solder balls 300. The head slider 100 is put directly and firstly on the attitude control layer 240, and then the slider electrical bonding pads of the head slider 100 are respectively and electrically bonded with associated solder balls 300 which are already coupled to the associated flexure electrical bonding pads of the suspension 200. For example, the reader bonding pads 131 on the head slider 100 is electrically bonded to the reader bonding pads 231 on the trace pattern 230 of the suspension 200 via solder balls 300, which is fully shown in the drawings. As an embodiment of the present invention, the ball bonding is implemented by ultrasonic bonding or/and laser beam heating with solders. The solders are dropped by a jet solder ball (a J-SBB) machine, and then laser bean or hot nitrogen reflows the solders. After solidification, the bonding surface 112 of the head slider 100 and the solder balls 300 are well electrically connected. Because of the ball bonding, a conductive connection is built up between the slider electrical bonding pads, solder balls, and the flexure electrical bonding balls, thus the suspension 200 is solidly affixed to the bonding surface 112 of the head slider 100. Hence, a controlling signal form the read/write electronic circuitry will be successfully conducted by the conductive traces 237 (shown in FIG. 9), then the conductive connection excellently and reliably transfers the signals to the head slider 100, thereby correctly finishing the reading or writing operations in accordance with the signals.

It can be readily seen that the interconnection of the head slider 100 to the suspension 200 has been achieved by bonding the bonding surface 112 of the head slider 100 to the suspension 200. Such interconnection of the present invention has several advantages. Firstly, by using the reverse surface of the air bearing surface 111 as bonding surface 112 and providing the bonding pads on the bonding surface 112, the bonding surface 112 has more available space for arranging more bonding pads to accommodate slider technology development. Secondly, the interconnection between the head slider 100 and the suspension 200 is easy to carry out since mechanically and electrically connecting the head slider 100 to the suspension 200 are both at the bonding surface 112 and only need one bonding process, concretely, the epoxy adhesive bonding process in the prior art is needless in the present invention. Thirdly, the interconnection between the head slider 100 and the suspension 200 has good performance on shocking and can avoid or reduce connection crack as no relative rotation may occur therebetween. In addition, the attitude control layer 240 is located between the head slider 100 and the suspension so as to prevent shorting therebetween. More important, the attitude control layer 240 serves as a datum plate for the head slider 100 lying thereon and supporting the head slider 100, so the head slider 100 can align easily with the suspension 200 so that a good attitude of the head slider 100 is ensured. Good attitude of the head slider, namely little pitch and roll variation, can reduce flying height variation, so data reading/writing performance of the head slider is improved. Furthermore, the attitude control layer 240 provides a clearance between the head slider 100 and the suspension 200 for easy inspection during attaching the head slider to the suspension 200.

It will be appreciated that the flexure electrical bonding pads (or slider electrical bonding pads) are arranged to be symmetrical about a point of the trace pattern 230 (or a metal lead layer 135) corresponding to a center of the head slider 100 to be mounted, which may facilitate decreasing slider thermal crown changes affected by variable constants of thermal expansion (CTE). In addition, it will also be appreciated that the slider electrical bonding pads and/or flexure electrical bonding pads of the present invention can be made of copper, gold or nickel, and the conductive traces are also preferably made from any conductive material such as gold or copper.

Figure 11A:
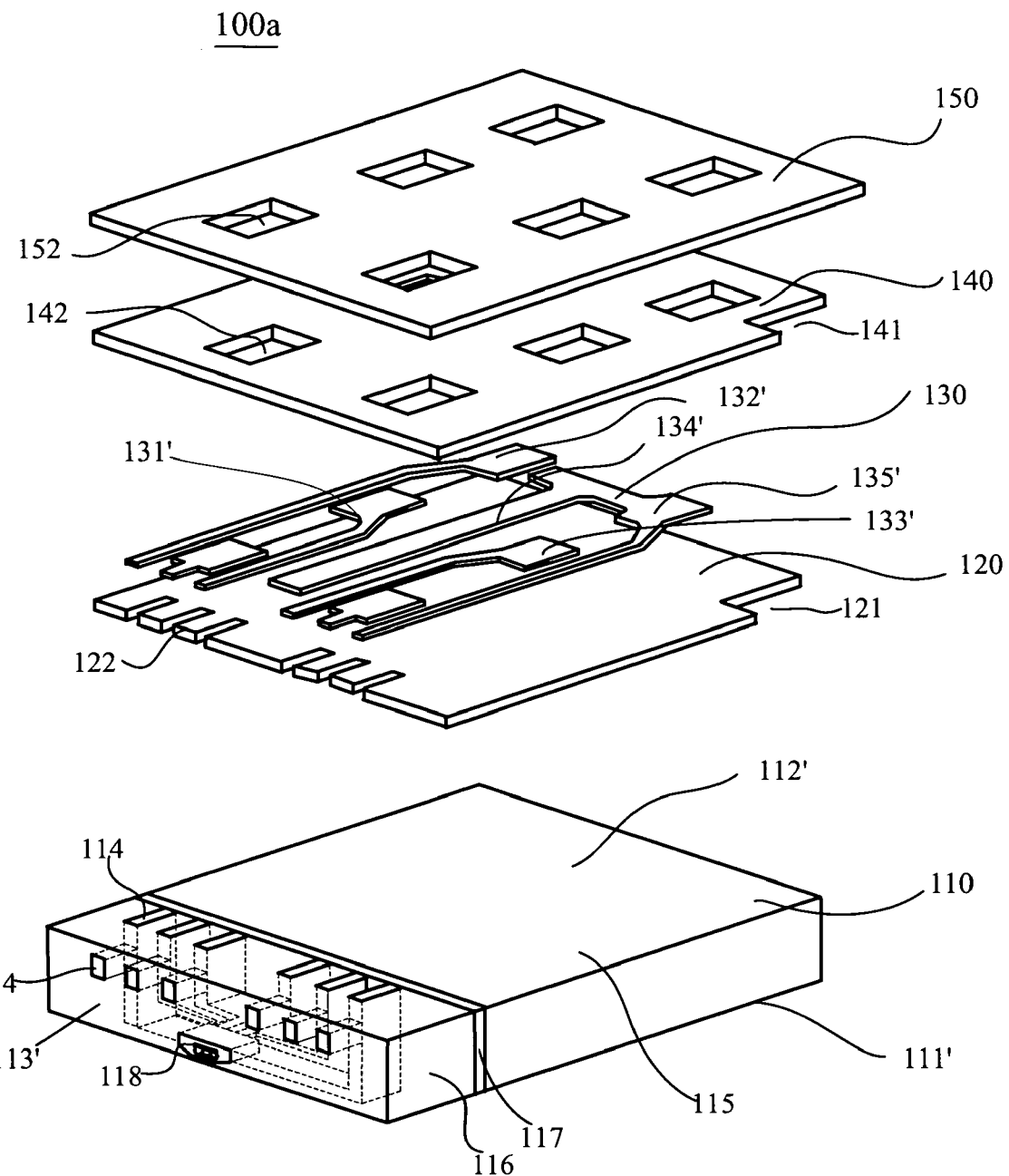
FIG. 11a is an exploded perspective view of a head slider of a second embodiment, in which a semi-insulation layer is electrically coupled to the head slider by circuit ground.

Alternatively, the head slider 100 can be designed to possess some optimized structure according to the invention. FIG 11a shows a second embodiment of a head slider 100a. As is shown, the head slider 100a comprises a slider body 110, a first insulation layer 120, a metal lead layer 130, a second insulation layer 140, and a semi-insulation layer 150, all of which are assembled together.

Figure 11B:
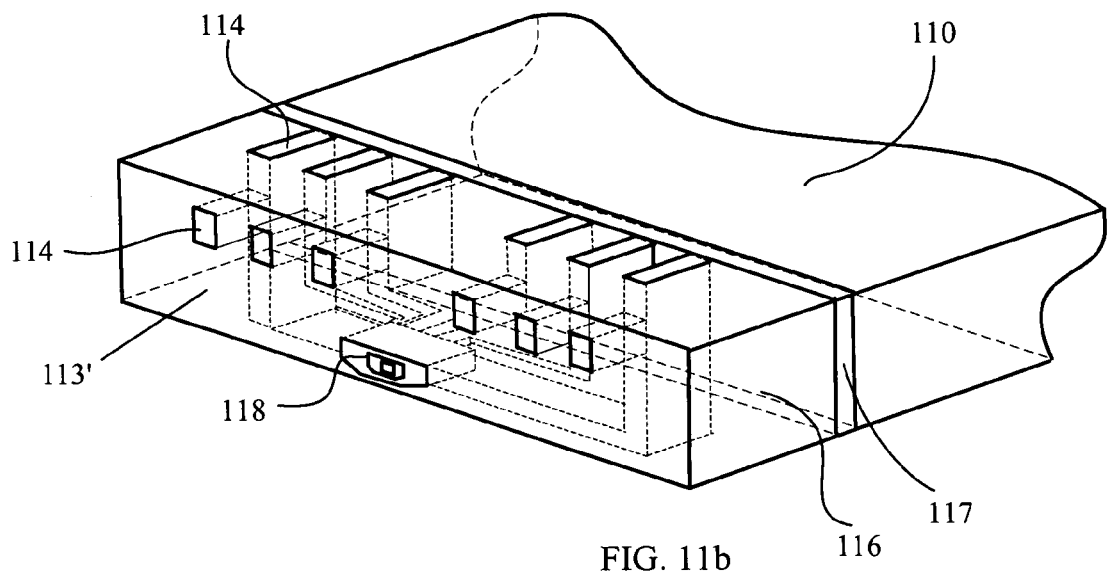
FIG. 11b is a partially enlarged perspective view of a slider body of the head slider shown in FIG 11a, illustrating secondary bonding pads of the slider body in detail.

Referring to FIG. 11a in conjunction with FIG. 11b, the slider body 110 has an air bearing surface 111', a bonding surface 112' opposite to the air bearing surface 111', a slider base 115, an overcoat 116, and an undercoat 117 between the slider base 115 and the overcoat 116. The secondary bonding pads 114 are formed on the undercoat 117. The slider body 110 is also provided with a read/write element 118 on the undercoat 117 and electrically connecting to each secondary bonding pad 114. Each secondary bonding pad 114 has one branch reaching to a trailing surface 113' of the overcoat 116 for probing test in wafer level and another branch reaching to the bonding surface 112' so as to electrically connect to the corresponding slider electrical bonding pad of the metal lead layer 130.

Also referring to FIG. 11a, the first insulation layer 120 is deposited on the slider body 110 and may be made of any insulating material, such as aluminum oxide ($Al_2O_3$). More specifically, the first insulation layer 120 is introduced on the bonding surface 112' of slider body 110 and over a substantial length as well as the full width of the slider body 110, thus sound electrical isolation can be achieved between the metal lead layer 130 and the slider body 110 as well as between the respective slider electrical bonding pads of the metal lead layer 130, as will be described in detail hereinafter. A side of the first insulation layer 120 is cut to form a zigzag edge 122 to expose the secondary bonding pads 114 and the respective slider electrical bonding pads therein when assembled so that the secondary bonding pads 114 and the respective slider electrical bonding pads can be connected. The first insulation layer 120 has a corner cut to form a first rectangular gap 121.

The metal lead layer 130 is formed on the first insulation layer 120. In the embodiment, a plurality of slider electrical bonding pads are formed integrally with the metal lead layer 130 and are symmetrical about a position of the metal lead layer 130 corresponding to a longitudinal centerline of the slider body 110. The slider electrical bonding pads of the metal lead layer 130 comprises one heater pad 132', one ground bonding pad 135', two reader bonding pads 131', and two writer bonding pads 133'. The metal lead layer 130 also provides a ground trace 134'. Understandably, the electrical bonding pads in this embodiment function similarly as those in the first embodiment.

The second insulation layer 140 is covered on the metal lead layer 130. The second insulation layer 140 provides a plurality of through holes 142 corresponding to the respective slider electrical bonding pads of the head slider 100a for soundly exposing the slider electrical bonding pads therein and thus realizing a direct-electrical interconnection between the suspension 200 and the head slider 100a. In addition, the second insulation layer 140 assists to avoid shorting between the slider electrical bonding pads and the flexure electrical bonding pads. The second insulation layer 140 also has a corner cut to form a second rectangular gap 141 corresponding to the first gap 121 of the first insulation layer 120 for facilitating electrical connection between the semi-insulation layer 150 and the slider body 110.

The semi-insulation layer 150 is covered on the second insulation layer 140 of the head slider 100a. The semi-insulation layer 150 has a plurality of through holes 152 corresponding to the respective through hole 142 of the second insulation layer 140 for exposing slider electrical bonding pads. In the embodiment, the semi-insulation layer 150 is electrically coupled to the slider body 110 for preventing electric static discharge (ESD) which is achieved by circuit ground through the first gap 121 defined in the first insulation layer 120 and the second gap 141 defined in the second insulation layer 140. Preferably, the semi-insulation layer 150 is a DLC layer (Diamond-Like Carbon layer).

Figure 12A:
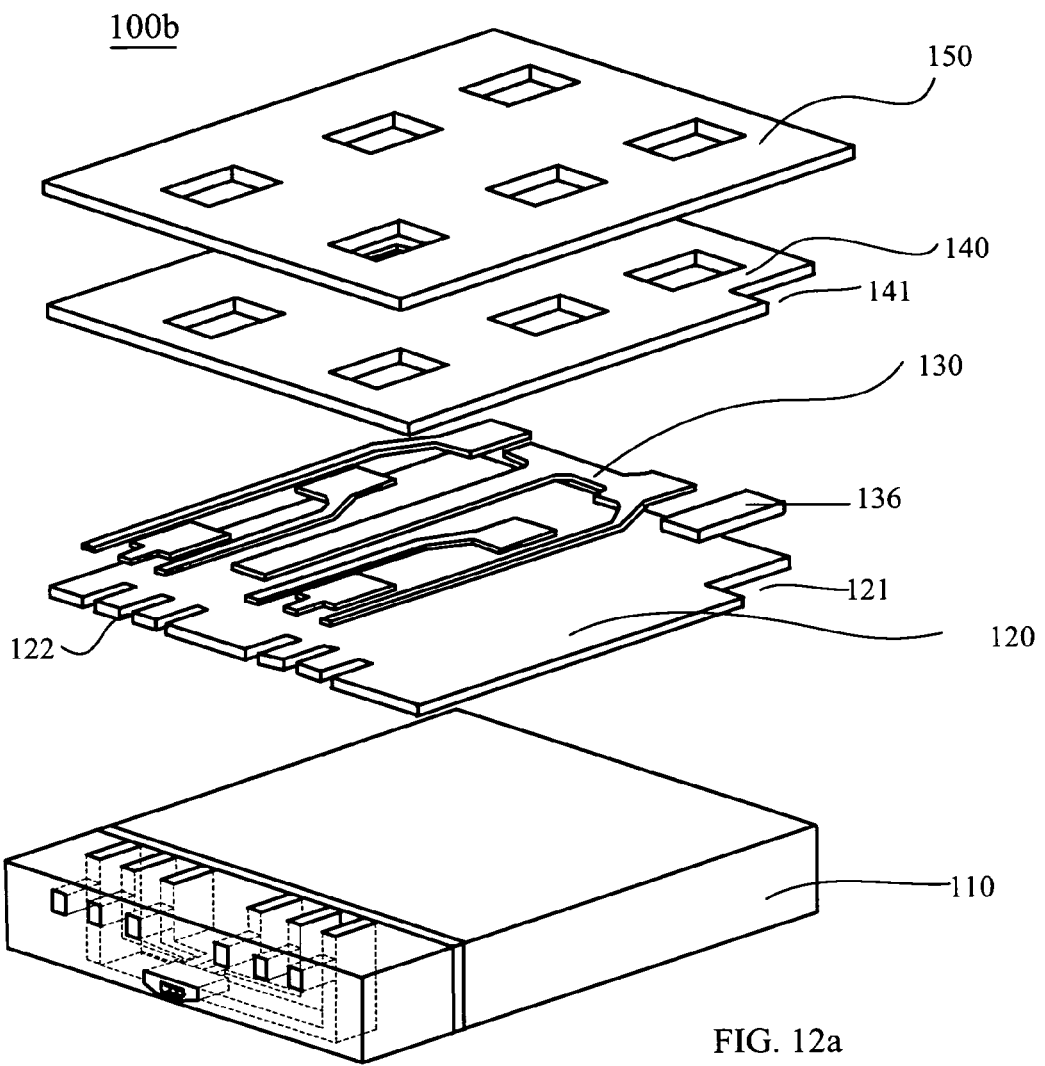
FIG. 12a is an exploded perspective view of a head slider of a third embodiment, in which a semi-insulation layer is electrically coupled to the head slider by an electro static discharge (ESD) bonding pad.

FIG. 12a shows a third embodiment of a head slider 100b of the present invention. The head slider 100b in the present embodiment is similar to the head slider 100a mentioned above except that the semi-insulation layer 150 of head slider 100b employs another way to ground the slider body 110. Concretely, the metal lead layer 130 provides an electro static discharge (ESD) bonding pad 136, and the semi-insulation layer 150 and the slider body 110 are respectively and electrically connected to the ESD bonding pad 136 through the first gap 121 defined in the first insulation layer 120 and the second gap 141 defined in the second insulation layer 140, thus realizing preventing ESD.

Figure 12B:
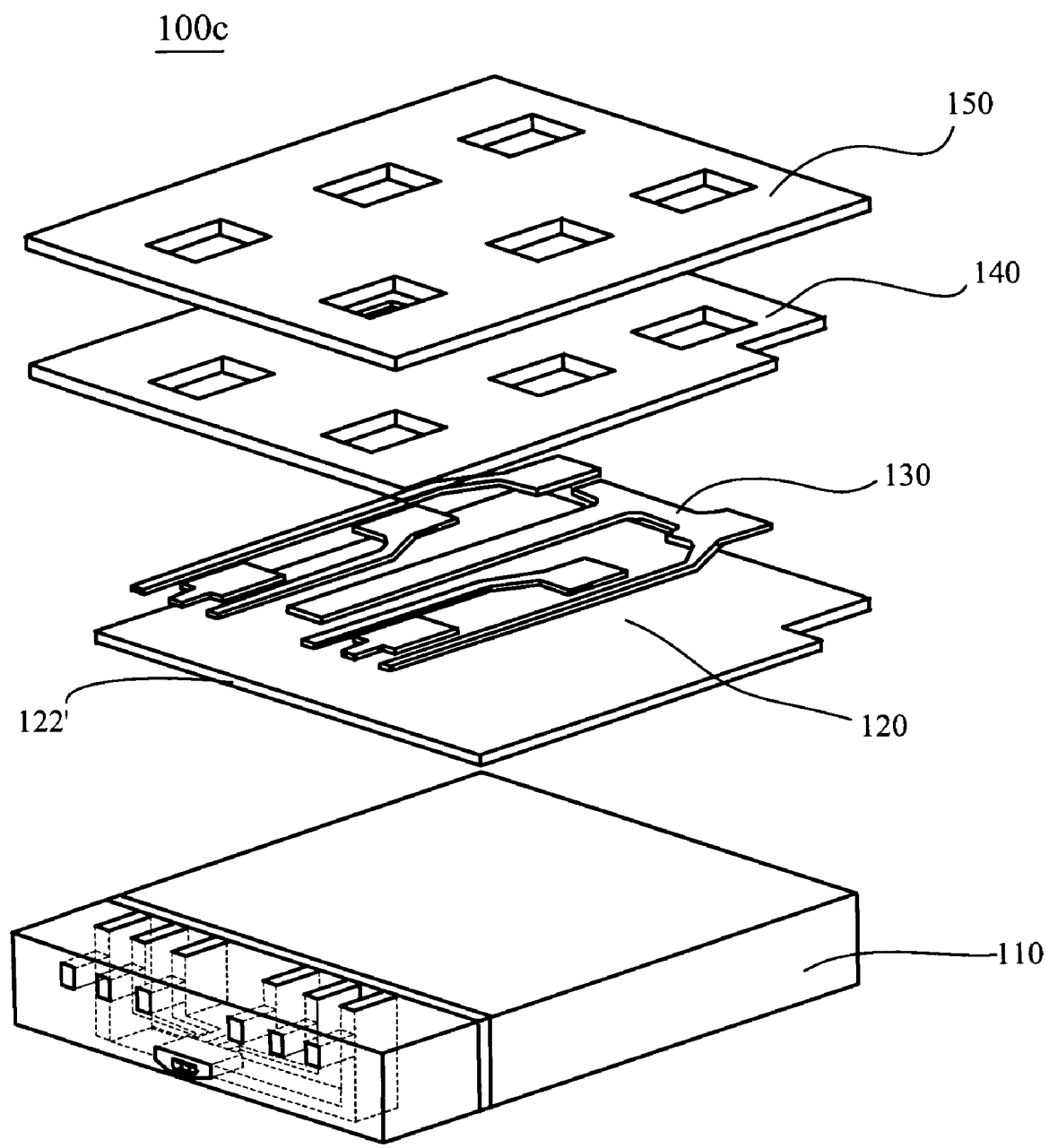
FIG. 12b is an exploded perspective view of a head slider of a fourth embodiment.

FIG. 12b shows a fourth embodiment of a head slider 100c of the present invention. The head slider 100c in the present embodiment is similar to the head slider 100a mentioned above except that the first insulation layer 120 has a side cut to form a straight edge 122'. That is, the first insulation layer 120 is shorter so as not to separate the secondary bonding pads 114 from the respective slider electrical bonding pads when assembled so that the secondary bonding pads 114 and the respective slider electrical bonding pads can be connected.

Figure 12C:
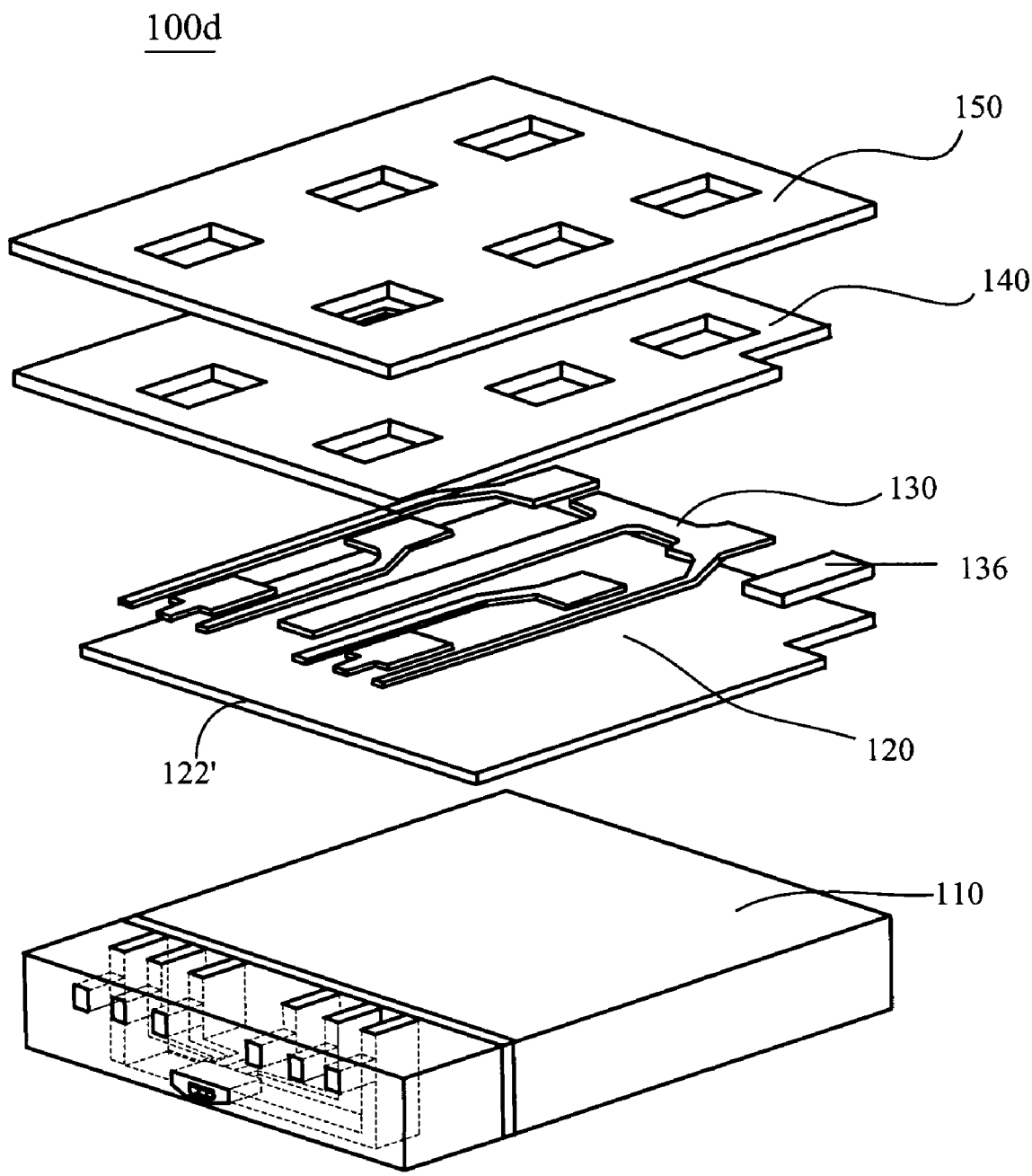
FIG. 12c is an exploded perspective view of a head slider of a fifth embodiment.

FIG. 12c shows a fifth embodiment of a head slider of the present invention. The head slider 100d in the present embodiment is similar to the head slider 100c mentioned above except that the semi-insulation layer 150 of the head slider 100d is electrically connected to the slider body through an electro static discharge (ESD) bonding pad 136.

FIGS. 13-20 show eight different shapes and combinations of alternative suspension according to the present invention.

Figure 13:
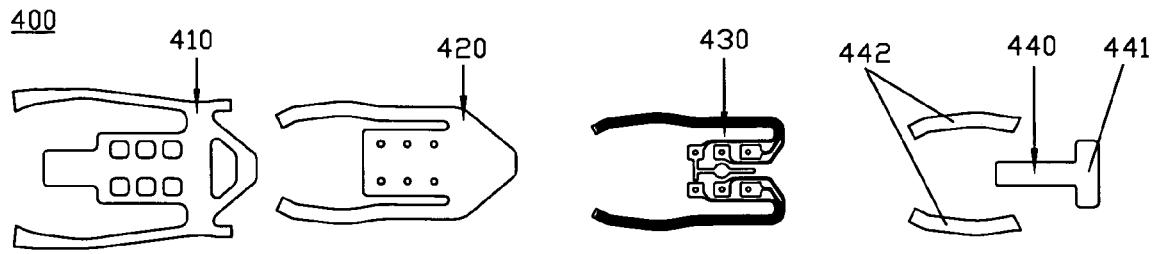
FIG. 13 is an exploded plan view of a suspension of a second embodiment according to the present invention.

FIG. 13 is an exploded, plan view of a suspension 400 of a second embodiment of the present invention. The suspension 400 is comprised of an attitude control layer 440, a trace pattern 430 with a plurality conductive traces and flexure electrical bonding pads, an insulation layer 420, and a metal substrate 410 with through holes corresponding to the flexure electrical bonding pads, wherein the trace pattern 430, the insulation layer 420 and the metal substrate 410 of the suspension 400 respectively have the same structure as those of the suspension 200 of the first embodiment. The only difference between the suspension 400 and the suspension 200 is that the attitude control 440 has a T-shaped head portion 441 for covering the conductive traces between the flexure electrical bonding pads and a pair of arm portions 442 separated from the T-shaped head portion 441 for covering the conductive traces around the flexure electrical bonding pads.

Figure 14:
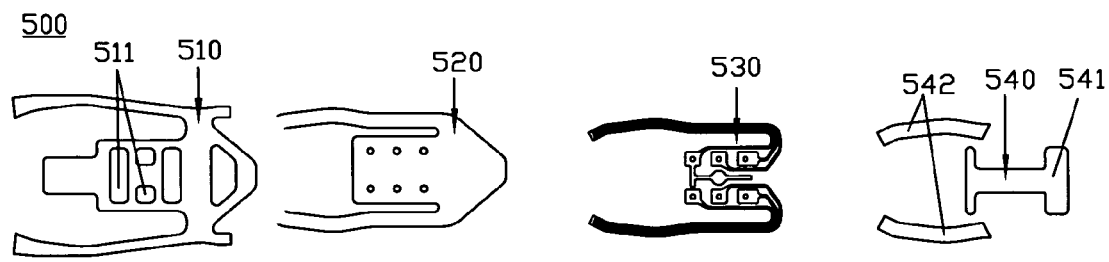
FIG. 14 is an exploded plan view of a suspension of a third embodiment according to the present invention.

FIG. 14 is an exploded, plan view of a suspension 500 of a third embodiment of the present invention. The suspension 500 is comprised of an attitude control layer 540, a trace pattern 530, an insulation layer 520, and a metal substrate 510. The trace pattern 530 and the insulation layer 520 of the suspension 500 respectively have the same structure as the trace pattern 430 and the insulation layer 420 of the suspension 400 mentioned above. The differences between the suspension 500 and the suspension 400 are that the attitude control layer 540 has an H-shaped head portion 541 and a pair of arm portions 542 separated from the H-shaped head portion 541, and that the metal substrate has though holes 511 symmetrical about a position of the metal substrate 510 corresponding to a center of the head slider to be mounted whereas the metal substrate 410 of the suspension 400 has through holes symmetrical about a centerline of the metal substrate 410.

Figure 15:
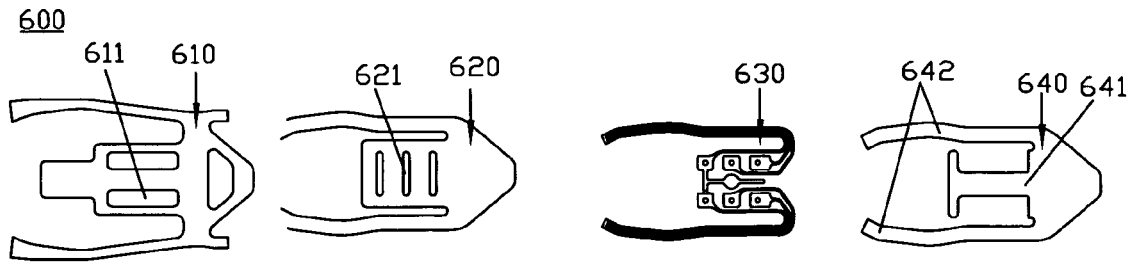
FIG. 15 is an exploded plan view of a suspension of a fourth embodiment according to the present invention.

FIG. 15 is an exploded, plan view of a suspension 600 of a fourth embodiment of the present invention. The suspension 600 is comprised of an attitude control layer 640, a trace pattern 630, an insulation layer 620, and a metal substrate 610. The trace pattern 630 of the suspension 600 has the same structure as the trace pattern 430 of the suspension 400 mentioned above. The differences between the suspension 600 and the suspension 400 are that the insulation layer 620 has through holes 621, each of which corresponds to two neighboring flexure electrical bonding pads of the trace pattern 630, and that the attitude control layer 640 has an H-shaped head portion 641 and a pair of arm portions 542 integrally formed with the H-shaped head portion 541, and that the metal substrate 610 of the suspension 600 has two though holes 611 symmetrical about a centerline of the metal substrate 610.

Figure 16:
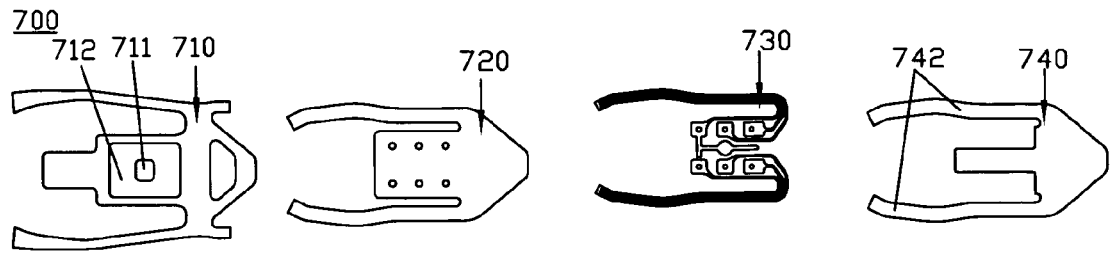
FIG. 16 is an exploded plan view of a suspension of a fifth embodiment according to the present invention.

FIG. 16 is an exploded, plan view of a suspension 700 of a fifth embodiment of the present invention. The suspension 700 is comprised of an attitude control layer 740, a trace pattern 730, an insulation layer 720, and a metal substrate 710. The trace pattern 730 and the insulation layer 720 of the suspension 700 respectively have the same structure as the trace pattern 430 and the insulation layer 420 of the suspension 400 mentioned above. The differences between the suspension 700 and the suspension 400 are that the attitude control layer 740 has a T-shaped head portion 741 and a pair of arm portions 742 integrally formed with the T-shaped head portion 541, and that the metal substrate 710 of the suspension 700 has a recessed portion 712 with a rectangular through hole 711 in the center thereof.

Figure 17:
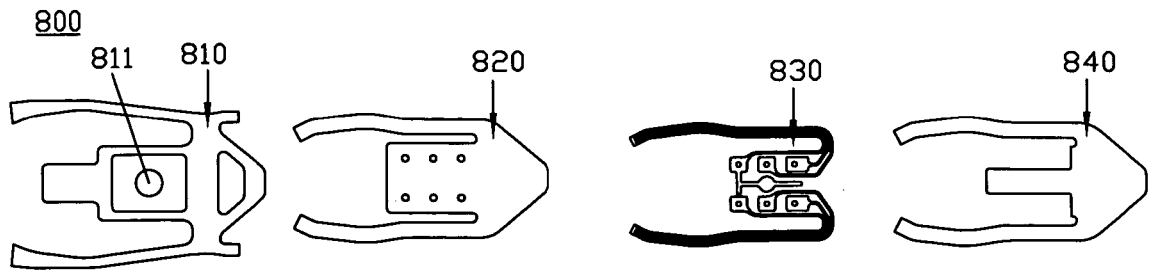
FIG. 17 is an exploded plan view of a suspension of a sixth embodiment according to the present invention.

FIG. 17 is an exploded, plan view of a suspension 800 of a sixth embodiment of the present invention. The suspension 800 is comprised of an attitude control layer 840, a trace pattern 830, an insulation layer 820, and a metal substrate 810. The attitude control layer 840, the trace pattern 830, and the insulation layer 820 of the suspension 800 respectively have the same structure as the attitude control layer 740, the trace pattern 730, and the insulation layer 720 of the suspension 700 mentioned above. The only difference between the suspension 800 and the suspension 700 is that the metal substrate 810 has a recessed portion with a circular through hole 811 in the center thereof.

Figure 18:
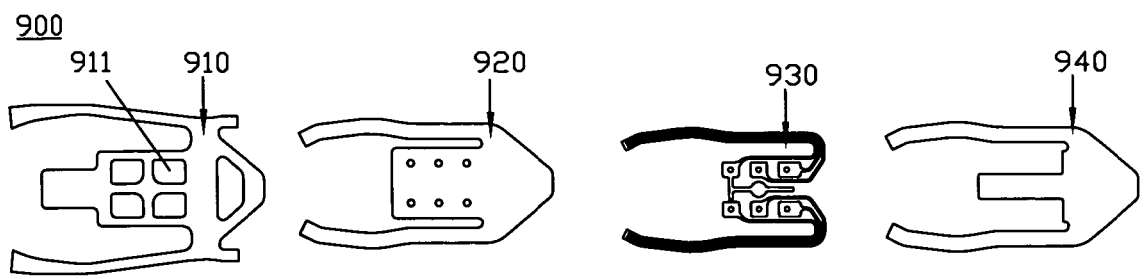
FIG. 18 is an exploded plan view of a suspension of a seventh embodiment according to the present invention.

FIG. 18 is an exploded, plan view of a suspension 900 of a seventh embodiment of the present invention. The suspension 900 is comprised of an attitude control layer 940, a trace pattern 930, an insulation layer 920, and a metal substrate 910. The attitude control layer 940, the trace pattern 930, and the insulation layer 920 of the suspension 900 respectively have the same structure as the attitude control layer 740, the trace pattern 730, and the insulation layer 720 of the suspension 700 mentioned above. The only difference between the suspension 900 and the suspension 700 is that the metal substrate 910 has four through holes 911 with a whole configuration symmetrical about a position of the metal substrate 910 corresponding to a center the head slider 100 to be mounted.

Figure 19:
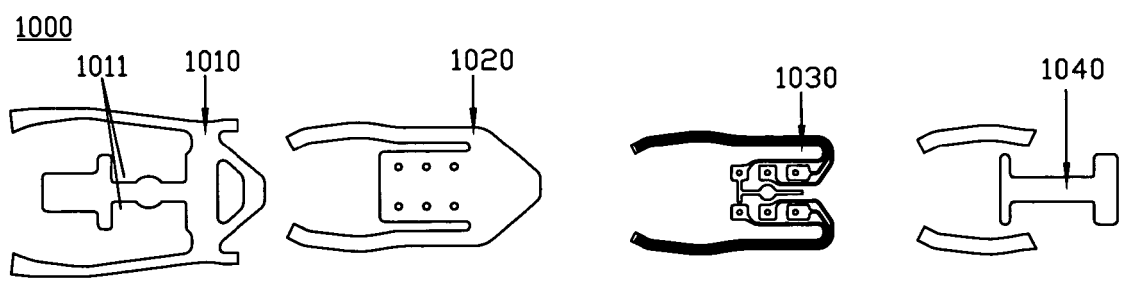
FIG. 19 is an exploded plan view of a suspension of an eighth embodiment according to the present invention.

FIG. 19 is an exploded, plan view of a suspension 1000 of an eighth embodiment of the present invention. The suspension 1000 is comprised of an attitude control layer 1040, a trace pattern 1030, an insulation layer 1020, and a metal substrate 1010. The attitude control layer 1040, the trace pattern 1030, and the insulation layer 1020 of the suspension 1000 respectively have the same structure as the attitude control layer 540, the trace pattern 530, and the insulation layer 520 of the suspension 500 mentioned above. The only difference between the suspension 1000 and the suspension 500 is that the metal substrate 1010 of the suspension 1000 has cutouts 1011 along edges thereof and the cutouts are symmetrical about a centerline of the metal substrate 1010.

Figure 20:
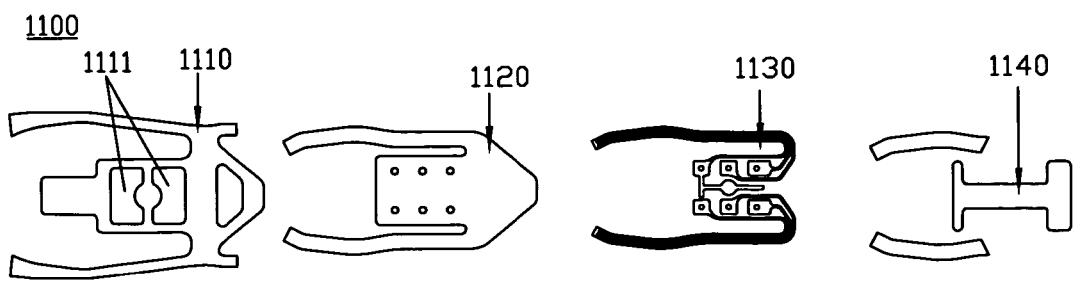
FIG. 20 is an exploded plan view of a suspension of a ninth embodiment according to the present invention.

FIG. 20 is an exploded, plan view of a suspension 1100 of a ninth embodiment of the present invention. The suspension 1100 is comprised of an attitude control layer 1140, a trace pattern 1130, an insulation layer 1120, and a metal substrate 1110. The control layer 1140, the trace pattern 1130, and the insulation layer 1120 of the suspension 1100 respectively have the same structure as the attitude control layer 540, the trace pattern 530, and the insulation layer 520 of the suspension 500 mentioned above. The only difference between the suspension 1100 and the suspension 500 is that the metal substrate 1110 has through holes 1111 symmetrical about a line perpendicular to a longitude centerline of the metal substrate 1110.

Figure 21:
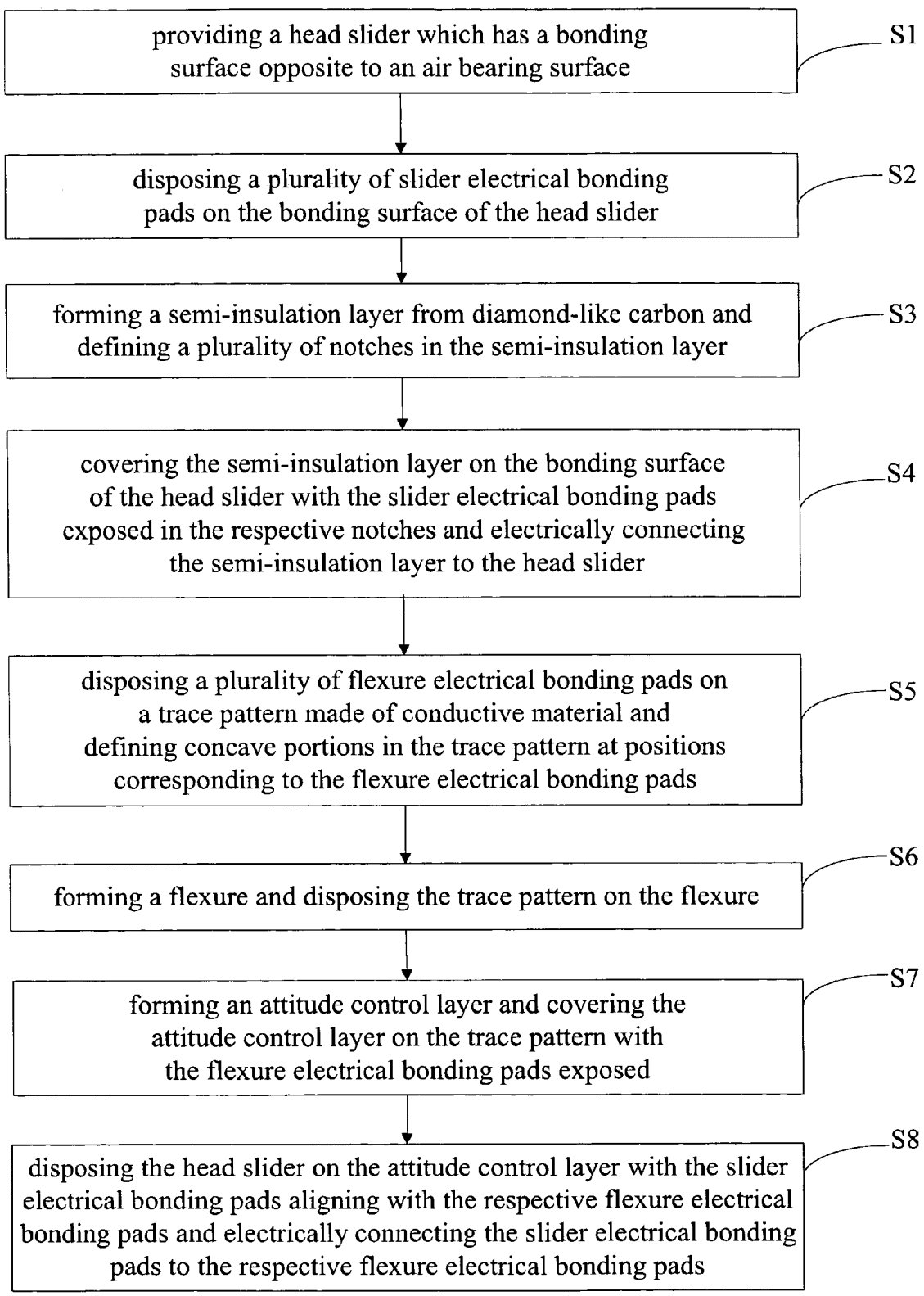
FIG. 21 is an example flowchart showing a method for fabricating the head gimbal assembly according to the present invention.

FIG. 21 is an example flowchart showing a method for fabricating the head gimbal assembly. According to the chart, steps of the fabricating method for the head gimbal assembly includes: providing a head slider which has an air bearing surface and a bonding surface opposite to the air bearing surface (shown as step S1); disposing a plurality of slider electrical bonding pads on the bonding surface of the head slider (shown as step S2); forming a semi-insulation layer and defining a plurality of notches in the semi-insulation layer, wherein the semi-insulation layer is made of diamond-like carbon (shown as step S3); covering the semi-insulation layer on the bonding surface of the head slider with the slider electrical bonding pads exposed in the respective notches and electrically connecting the semi-insulation layer to the head slider (shown as step S4); disposing a plurality of flexure electrical bonding pads on a trace pattern made of conductive material and defining concave portions in the trace pattern at positions corresponding to the flexure electrical bonding pads (step S5); forming a flexure and disposing the trace pattern on the flexure (shown as step S6); forming an attitude control layer and covering the attitude control layer on the trace pattern with the flexure electrical bonding pads exposed (shown as step S7); disposing the head slider on the attitude control layer with the slider electrical bonding pads aligning with the respective flexure electrical bonding pads and electrically connecting the slider electrical bonding pads to the respective flexure electrical bonding pads (shown as step S8).

Thus, the present invention provides, in various embodiments, an improved head gimbal assembly, a magnetic disk drive unit, a suspension, and an improved method for fabricating the head gimbal assembly. The foregoing descriptions of specific embodiments have been presented for purposes of illustration and description. They are not intended to be exhaustive or to limit the invention to the precise forms disclosed, and many modifications and variations are possible in light of the above teaching. The embodiments were chosen and described in order to best explain the principles of the invention and its practical application, and to enable others skilled in the art to best utilize the invention and various embodiments with various modifications as are suited to the particular use contemplated. It is intended that the scope of the invention be defined by the claims appended hereto and their equivalents.

What is claimed is:

1. A head gimbal assembly, comprising:
   a head slider having an air bearing surface, a bonding surface opposite to the air bearing surface, and a plurality of slider electrical bonding pads arranged on the bonding surface; and
   a suspension having a flexure and an attitude control layer, a plurality of flexure electrical bonding pads being arranged on the flexure, the attitude control layer being covered on the flexure with the flexure electrical bonding pads exposed, the head slider being disposed on the attitude control layer with the slider electrical bonding pads aligning with the respective flexure electrical bonding pads so that the slider electrical bonding pads and the respective flexure electrical bonding pads are electrically connected.

2. The head gimbal assembly according to claim 1, wherein the suspension further comprises a trace pattern disposed on the flexure, and the flexure electrical bonding pads are integrally formed with the trace pattern.

3. The head gimbal assembly according to claim 2, wherein the trace pattern defines concave portions at positions corresponding to the flexure electrical bonding pads.

4. The head gimbal assembly according to claim 3, wherein the concave portions are pierced to be through holes.

5. The head gimbal assembly according to claim 4, wherein the flexure defines concave portions at positions corresponding to the through holes of the trace pattern.

6. The head gimbal assembly according to claim 2, wherein the flexure comprises a metal substrate and an insulation layer, and the insulation layer is sandwiched between the metal substrate and the trace pattern.

7. The head gimbal assembly according to claim 6, wherein the metal substrate has a stress-releasable portion partially hollowed out at a position under the flexure electrical bonding pads.

8. The head gimbal assembly according to claim 7, wherein the stress-releasable portion has a plurality of through holes or cutouts symmetrically arranged.

9. The head gimbal assembly according to claim 6, wherein the insulation layer defines a plurality of concave portions at positions corresponding to the flexure electrical bonding pads.

10. The head gimbal assembly according to claim 2, wherein the trace pattern has a plurality of conductive traces extending from the flexure electrical bonding pads respectively to an external control circuitry, and the attitude control layer is configured to at least partially cover the conductive traces.

11. The head gimbal assembly according to claim 10, wherein the attitude control layer is T-shaped.

12. The head gimbal assembly according to claim 10, wherein the attitude control layer has a T-shaped head portion for covering the conductive traces between the flexure electrical-bonding pads and a pair of arm portions for covering the conductive traces around the flexure electrical bonding pads.

13. The head gimbal assembly according to claim 10, wherein the attitude control layer has an H-shaped head portion for covering the conductive traces between the flexure electrical bonding pads and a pair of arm portions for covering the conductive traces around the flexure electrical bonding pads.

14. The head gimbal assembly according to claim 1, wherein the head slider further comprises a semi-insulation layer with a plurality of notches, and the semi-insulation layer is covered on the bonding surface of the head slider and electrically connected to the head slider with the slider electrical bonding pads exposed in the respective notches.

15. The head gimbal assembly according to claim 14, wherein the semi-insulation layer is a diamond-like carbon layer.

16. The head gimbal assembly according to claim 14, wherein the slider electrical bonding pads comprises an ESD bonding pad electrically connecting the semi-insulation layer and the head slider.

17. The head gimbal assembly according to claim 1, wherein the head slider further has a plurality of secondary bonding pads located on a trailing surface of the head slider, and the secondary bonding pads electrically connects to the respective slider electrical bonding pads.

18. The head gimbal assembly according to claim 1, wherein the head slider further comprises a metal lead layer, a first insulation layer sandwiched between the bonding surface of the head slider and the metal lead layer, and a second insulation layer covered on the metal layer, the slider electrical bonding pads are integrally formed with the metal lead layer, and the second insulation layer provides a plurality of notches for exposing the respective slider electrical bonding pads therein.

19. The head gimbal assembly according to claim 18, wherein the slider electrical bonding pads comprises at least one ground bonding pad, at least one reader bonding pad, and at least one writer bonding pad, the metal lead layer has at least one ground trace connecting the ground bonding pad and disposed between the reader bonding pad and the writer bonding pad.

20. The head gimbal assembly according to claim 18, wherein the slider electrical bonding pads comprises a heater pad.

21. A magnetic disk drive comprising:
a head gimbal assembly;
a drive arm to connect with the head gimbal assembly;
a disk; and
a spindle motor to spin the disk;
wherein the head gimbal assembly comprises:
a head slider having an air bearing surface, a bonding surface opposite to the air bearing surface, and a plurality of slider electrical bonding pads arranged on the bonding surface; and
a suspension having a flexure and an attitude control layer, a plurality of flexure electrical bonding pads being arranged on the flexure, the attitude control layer being covered on the flexure with the flexure electrical bonding pads exposed, the head slider being disposed on the attitude control layer with the slider electrical bonding pads aligning with the respective flexure electrical bonding pads so that the slider electrical bonding pads and the respective flexure electrical bonding pads are electrically connected.

22. The magnetic disk drive according to claim 21, wherein the suspension further comprises a trace pattern disposed on the flexure, and the flexure electrical bonding pads are integrally formed with the trace pattern.

23. The magnetic disk drive according to claim 22, wherein the trace pattern has a plurality of conductive traces extending from the flexure electrical bonding pads respectively to an external control circuitry, and the attitude control layer is configured to at least partially cover the conductive traces.

24. The magnetic disk drive according to claim 23, wherein the attitude control layer is T-shaped.

25. The magnetic disk drive according to claim 23, wherein the attitude control layer has a T-shaped head portion for covering the conductive traces between the flexure electrical bonding pads and a pair of arm portions for covering the conductive traces around the flexure electrical bonding pads.

26. The magnetic disk drive according to claim 23, wherein the attitude control layer has an H-shaped head portion for covering the conductive traces between the flexure electrical bonding pads and a pair of arm portions for covering the conductive traces around the flexure electrical bonding pads.

27. The magnetic disk drive according to claim 21, wherein the head slider further comprises a semi-insulation layer with a plurality of notches, and the semi-insulation layer is covered on the bonding surface of the head slider and electrically connected to the head slider with the slider electrical bonding pads exposed in the respective notches.

28. The magnetic disk drive according to claim 27, wherein the semi-insulation layer is diamond-like carbon layer.

29. A method of fabricating a head gimbal assembly comprising steps of:
(1) providing a head slider which has an air bearing surface and a bonding surface opposite to the air bearing surface;
(2) disposing a plurality of slider electrical bonding pads on the bonding surface of the head slider;
(3) forming a flexure and disposing a plurality of flexure electrical bonding pads on the flexure;
(4) forming an attitude control layer and covering the attitude control layer on the flexure with the flexure electrical bonding pads exposed; and
(5) disposing the head slider on the attitude control layer with the slider electrical bonding pads aligning with the respective flexure electrical bonding pads and electrically connecting the slider electrical bonding pads to the respective flexure electrical bonding pads.

30. The fabricating method according to claim 29, wherein between steps (2) and (3) further comprises steps of:
forming a semi-insulation layer and defining a plurality of notches in the semi-insulation layer; and
covering the semi-insulation layer on the bonding surface of the head slider with the slider electrical bonding pads exposed in the respective notches and electrically connecting the semi-insulation layer to the head slider.

31. The fabricating method according to claim 30, wherein the semi-insulation layer is made of diamond-like carbon.

32. The fabricating method according to claim 29, wherein the flexure electrical bonding pads is formed on a trace pattern made of conductive material.

33. The fabricating method according to claim 32, wherein the step (3) further comprises a step of defining concave portions in trace pattern at positions corresponding to the flexure electrical bonding pads.

34. A suspension for supporting a head slider comprising:
a flexure;
a trace pattern disposed on the flexure, the trace pattern having a plurality of flexure electrical bonding pads; and
an attitude control layer at least partially covered on the flexure and the trace pattern with the flexure electrical bonding pads exposed.

35. The suspension according to claim 34, wherein at least one of the trace pattern and the flexure defines concave portions at positions corresponding to the flexure electrical bonding pads.

36. The suspension according to claim 34, wherein the trace pattern has a plurality of conductive traces extending from the flexure electrical bonding pads respectively to an external control circuitry, and the attitude control layer is configured to at least partially cover the conductive traces.

37. The suspension according to claim 36, wherein the attitude control layer is T-shaped.

38. The suspension according to claim 36, wherein the attitude control layer has a T-shaped head portion for covering the conductive traces between the flexure electrical bonding pads and a pair of arm portions for covering the conductive traces around the flexure electrical bonding pads.

39. The suspension according to claim 36, wherein the attitude control layer has an H-shaped head portion for covering the conductive traces between the flexure electrical bonding pads and a pair of arm portions for covering the conductive traces around the flexure electrical bonding pads.

* * * * *